United States Patent [19]
Schulz-Harder et al.

[11] Patent Number: 6,014,312
[45] Date of Patent: Jan. 11, 2000

[54] COOLER OR HEAT SINK FOR ELECTRICAL COMPONENTS OR CIRCUITS AND AN ELECTRICAL CIRCUIT WITH THIS HEAT SINK

[75] Inventors: Jürgen Schulz-Harder, Lauf; Karl Exel, Rimbach/Odw.; Bernd Medick, Wunsiedel; Veronika Bauer-Schulz-Harder, Lauf, all of Germany

[73] Assignee: Curamik Electronics GmbH, Eschenbach, Germany

[21] Appl. No.: 09/038,016

[22] Filed: Mar. 11, 1998

[30] Foreign Application Priority Data

Mar. 17, 1997 [DE] Germany ............................ 197 10 783

[51] Int. Cl.⁷ ...................................................... H05K 7/20

[52] U.S. Cl. .......................... 361/699; 165/80.4; 257/714

[58] Field of Search ................... 165/80.4, 80.5, 165/185, 168; 257/714; 361/689, 692–693, 698, 699, 700–702

[56] References Cited

U.S. PATENT DOCUMENTS

| | | | |
|---|---|---|---|
| 4,494,171 | 1/1985 | Bland et al. | 361/698 |
| 4,559,580 | 12/1985 | Lutfy | 361/699 |
| 4,859,520 | 8/1989 | Dubuisson et al. | |
| 4,975,803 | 12/1990 | Niggemann. | |
| 4,998,181 | 3/1991 | Haws | 165/80.4 |
| 5,269,372 | 12/1993 | Chu et al. | 165/80.4 |
| 5,423,376 | 6/1995 | Julien et al. | |
| 5,437,328 | 8/1995 | Simons | 361/692 |
| 5,835,345 | 11/1998 | Staskus et al. | 361/699 |

*Primary Examiner*—Gregory Thompson
*Attorney, Agent, or Firm*—Hoffman, Wasson & Gitler, PC

[57] ABSTRACT

The invention relates to a cooler for use as a heat sink for electrical components or circuits consisting of several cooler layers which are joined flat to one another, which are stacked on top of one another, which form between channels through which coolant flows and which each discharge into at least one first collection space for supply of the coolant and into a second collection space for draining the coolant, the collection spaces being formed by openings in the cooler layers and the cooling channels by structuring at least one area of the coolant layers with openings, the area being between the openings.

28 Claims, 23 Drawing Sheets

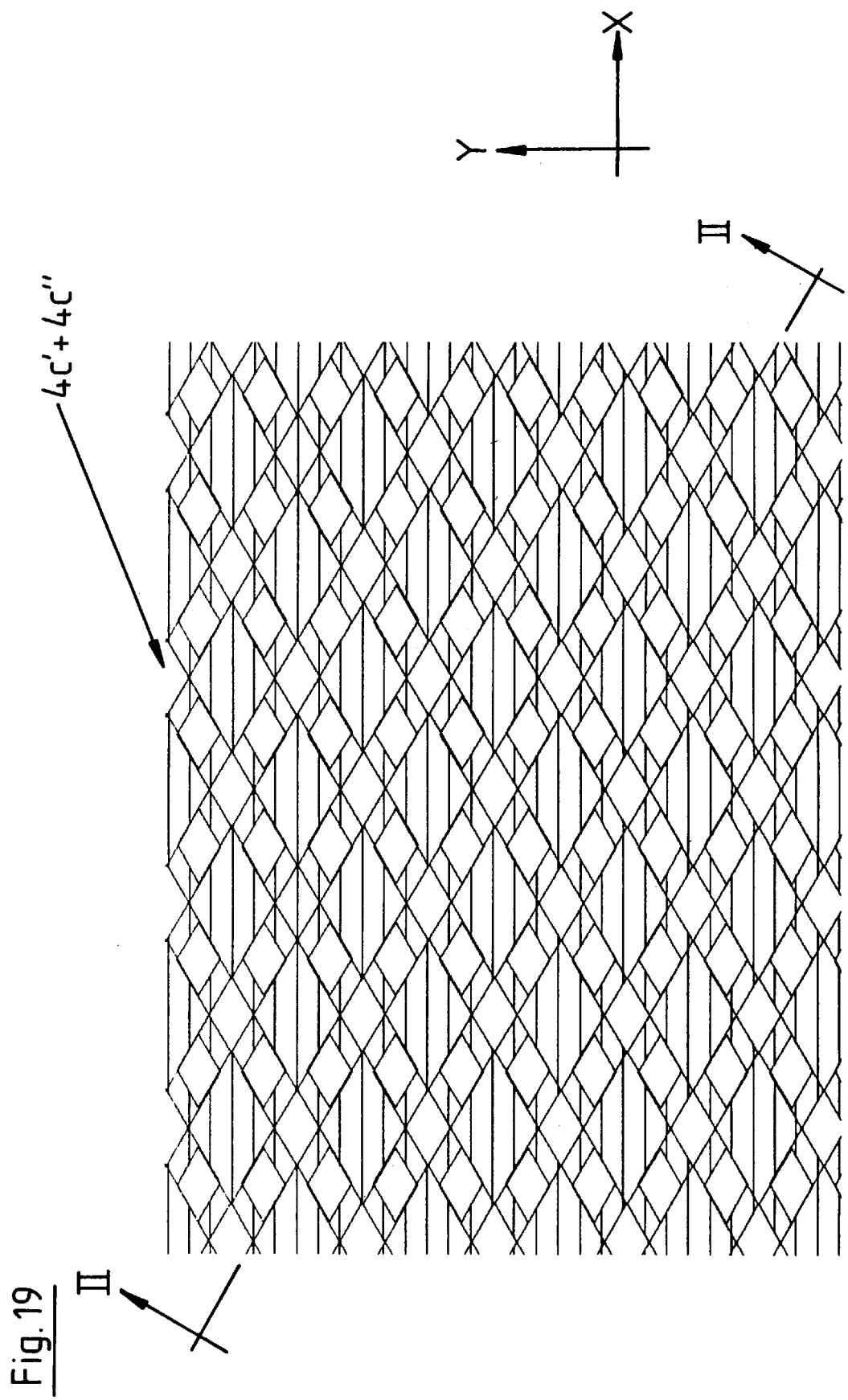

COOLER OR HEAT SINK FOR ELECTRICAL COMPONENTS OR CIRCUITS AND AN ELECTRICAL CIRCUIT WITH THIS HEAT SINK

BACKGROUND OF THE INVENTION

The invention relates to a cooler, for use as a heat sink for electrical components or circuits, consisting of several cooler layers which are joined flat to one another, which are stacked on top of one another, which are formed between channels through which coolant flows and which each discharge into at least one first collection space for supply of the coolant and into a second collection space for draining the coolant. The collection spaces are formed by openings in the cooler layers and the cooling channels by structuring at least one area of the cooler layers with openings, the area is located between the openings.

Furthermore, the invention relates to an electrical circuit with at least one electrical or electronic component and with a cooler as the heat sink for the component.

Heat sinks for electrical components, especially heat sinks which consist of a plurality of layers stacked on top of one another, are known. The use of metal layers which are joined to one another by means of the so-called "DCB process" (direct copper bond technology) is known in this case.

The object of the invention is to devise a cooler which can be produced in a simple manner.

SUMMARY OF THE INVENTION

One special feature of the invention is that the channels through which the coolant flows within the cooler are formed by the individual cooler layers having an area which is structured in the manner of a screen. The screen has a plurality of openings with edge lines closed and with material crosspieces or material areas remaining between these openings. None of the openings in any cooler layer, form a continuous channel which extends from one collection space for supplying coolant to a collection space for draining coolant. The individual openings and the material crosspieces, or material areas, provided between them are offset from cooler layer to cooler layer, such that flow of the coolant through the cooler is only possible with continuous changing of the layers and use of the openings. Within the cooler, a very branched labyrinth exists through which the coolant flow arises. The flow paths formed by the openings have material sections opposite the openings. The size of the openings and the width of the material sections, or material crosspieces, are matched to one another such that flow through is possible with continual changing of layers.

BRIEF DESCRIPTION OF THE DRAWINGS

The invention is detailed using figures for the embodiments.

FIG. 19 shows an enlarged detailed view of FIG. 16;

DETAILED DESCRIPTION OF THE PREFERRED EMBODIMENTS OF THE INVENTION

Figure 1:
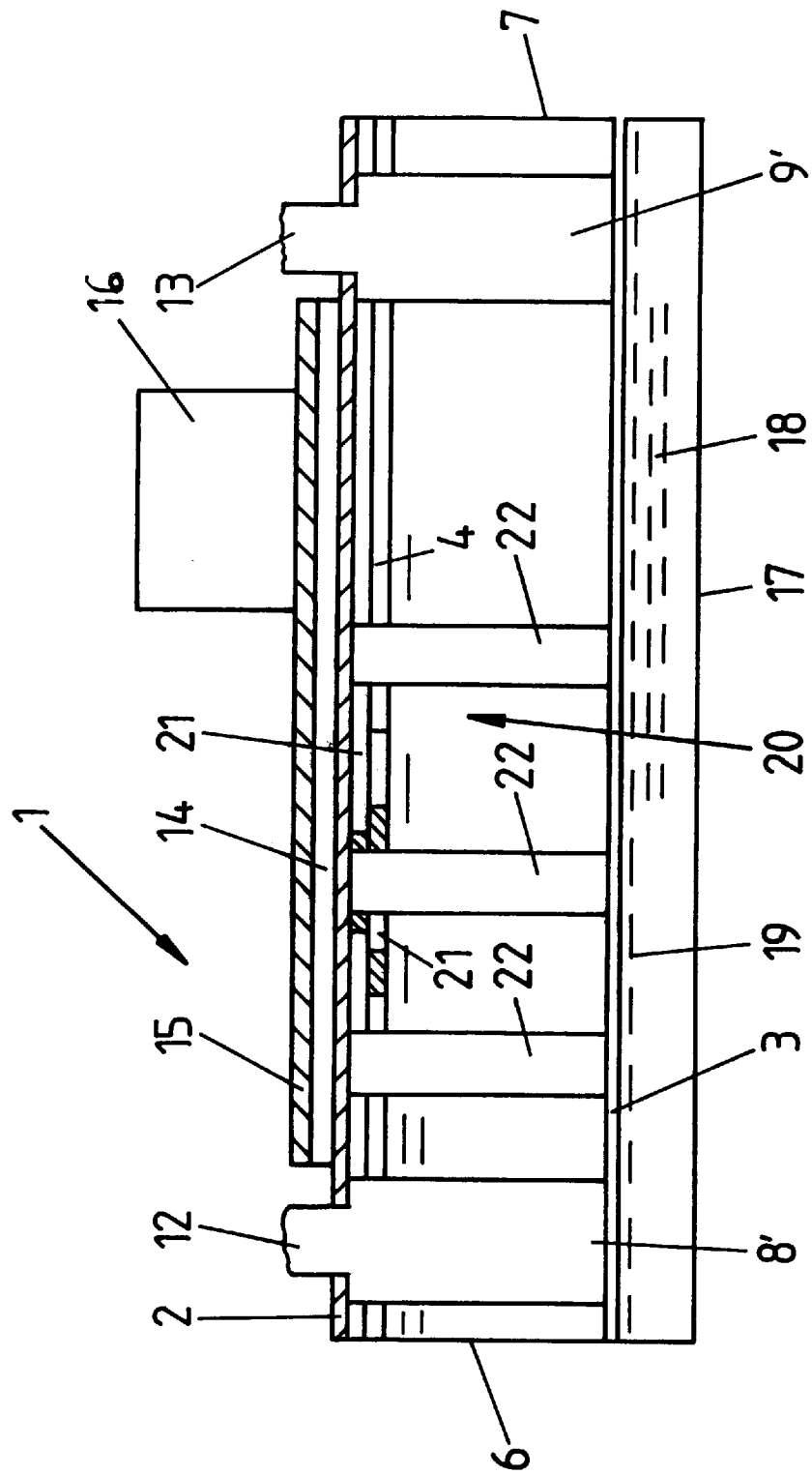
FIG. 1 shows in a simplified representation, and in section, a cooler produced from a plurality of layers formed by a metal foil and stacked on top of one another (heat sink) as claimed in the invention.

FIG. 1, in a simplified view, and in a section, shows cooler 1 which includes a plurality of thin layers which are joined to one another and stacked on top of one another. More specifically, upper and lower sealing layers 2 and 3, and a plurality of cooler layers located between them, which are labelled 4 in FIG. 1, but which in fact have different layouts are detailed below. Cuboid-shaped cooler 1, in an overhead view, has a square peripheral surface.

In a preferred embodiment shown, layers 2–4 are formed from thin plates, or foils of metal, for example, copper, and are joined flat to one another to cooler 1, for example, by using DCB technology. Other methods for joining layers 2–4, flat to one another, for the cooler are usable, for example, diffusion bonding, in which layers 2–4 are welded on their boundary surfaces under high pressure and the action of heat.

Cooler layers 4 are generally structured, such that in the area of two opposing sides 6 or 7, they have openings 8 and 9 which are closed to sides 6 and 7, and peripheral sides 10 and 11, of a respective cooler layer 4, which follow at a right angle. In the embodiment shown in the Figures, the area of opposing sides 6 and 7 are each made as an equilateral obtuse triangle (as a triangle with an angle much greater than 90 degrees between the two equal sides). Individual cooler layers 4 are arranged congruently with their openings 8 and 9 such that opening 8 forms collection space 8' for supplying a coolant and opening 9 forms collection space 9' for draining the coolant. On upper sealing layer 3, for collection spaces 8' and 9', there are connections 12 and 13. Connection 12 can be connected to a coolant feed and connection 13 to a coolant return.

In cooler 1, of FIG. 1, on the side of sealing layer 2, facing away from the cooler layers 4, a ceramic layer 14 is attached, on which then there is another structured metal layer 15. The latter is formed, for example, by a metal foil which has been structured using conventional techniques in order to obtain the desired layout for electrical printed circuits, contact surfaces, etc. The metal foil which forms metal coating 15 is for example, a copper foil. Ceramic layer 14, and the metal layer which forms the metal coating 15, are, for example, joined to the cooler 1, and to one another, using DCB technology.

Electrical components which are suitably attached to the metal coating 15, or the contact surfaces formed by it, are labelled 16. In components 16, with extremely high power, there is the possibility of attaching them directly to the upper sealing layer 2, if this is allowed by the respective component 16.

Ceramic layer 14 can be a layer of aluminum oxide ceramic. It is also possible for the ceramic layer 14 to include at least in partial areas, an aluminum nitride ceramic, to achieve as great a cooling action as possible, and as small as thermal resistance as possible.

The bottom of the cooler 1, formed on lower sealing layer 3 in FIG. 1, has connected thereto a metal support element 17. This support element 17 can be a plate, or can be made with channels, which, in FIG. 1, are shown by broken lines 18, and which are used for supplying and draining coolant. The support element 17 channels are joined to the collection spaces 8' and 9'. Connections 12 and 13 can then be eliminated or sealed. When using channels 18, lateral joining of the cooler 1 to the coolant feed or to the coolant return, is possible. If support 17 has channels 18, this support can be formed from a plurality of interconnected layers, which can be made of metal. Each layer would have at least two slot-like recesses and the same recesses of each layer are located congruently with one another so that channels 18 are formed for supplying and draining the coolant.

In FIG. 1, an insulating layer, or a ceramic layer on lower sealing layer 3, is shown and labeled 19. This ceramic layer 19, which is formed by an aluminum oxide ceramic, is used when an insulated attachment of cooler 1, on a plate forms support 17. Ceramic layer 19 is connected to cooler 1 and/or to support element 17 using DCB technology. There is also the possibility of having the top and/or bottom sealing layer 2 or 3, be a ceramic layer, if this is the case, ceramic layers 14 and 19 can be omitted.

It is common to all the embodiments detailed above, that the cooler layers 4 between the two openings 8 and 9, have an area which is structured in the manner of a screen and which has a plurality of openings 21, and which is generally labelled 20 in FIG. 1. This area 20, and the openings 8 and 9 of each cooler layer 4, provided on either side of that area, are located within a closed edge area of the cooler layer 4. Area 20 is made with openings and with network-like material crosspieces, or regions, which remain between these openings, such that cooler layers 4 which adjoin one another in the manner of stacks, with certain partial regions of material crosspieces, or sections which are joined to one another, and which always abut one another continuously, from cooler layer to cooler layer, form continuous columns 22 which lie with their longitudinal extension perpendicular to the planes of layers 2–4 and extend from upper the sealing layer 2 as far as the lower sealing layer 3. Each of the openings 21, in cooler layer 4, overlaps in the viewing direction perpendicular to the planes of the layers 2–4, at least one opening 21 of an adjacent cooler layer 4 only in part, so that each opening 21 of cooler layer 4 is also opposite at least one other partial area of at least one material crosspiece, or material section, of an adjacent cooler layer. In this way, between the columns 22, flow paths are formed which continually change layers and which are repeatedly angled for the coolant which then, only with continuous changing of planes, at least with continuous changing of the planes between adjacent cooler layers 4, coolant can travel from collection space 8' to collection space 9'. In doing so, the columns 22, which are each provided at a distance to one another, and repeatedly following one another in the axial direction between collection spaces 8' and 9', are exposed to intensive flow on all sides, as are the material crosspieces, or material sections, of the cooler layers 4 laterally from these columns, with which especially intensive cooling action or especially high efficiency is achieved.

It was assumed above, that in cooler 1, cooler layers 4 with the indicated structure adjoin one another. There is also the possibility that each cooler layer 4 is formed by several layers.

FIGS. 2–8 explain in detail one possible embodiment of cooler layers 4 of a cooler 1a. These cooler layers are labelled 4a' and 4a" in FIGS. 2–8. In the stack which forms cooler 1a, one cooler layer 4a' directly adjacent to a cooler layer 4a" and vice versa. As is detailed below, cooler layers 4a' and 4a", with respect to structured area 20a and 20a", are made such that turning of cooler layer 4a', around middle axis M which runs in the middle between two peripheral sides 6 and 7, and parallel to these peripheral sides, yields cooler layer 4a".

Cooler layer 4a', is made up of a square cutout from the metal foil, for example, a copper foil. Cutout 23 forms peripheral sides 6, 7, 10, and 11, which each adjoin one another at a right angle and of which peripheral sides 6 and 7, as well as 10 and 11, run parallel to one another and are opposite one another. In each of the corner areas of the cutout 23, there is one hole 24". The center points of the holes 24" form the corner points of an imaginary square which lies with its sides parallel to the sides 6, 7, 10 and 11. As especially shown by FIG. 2, cooler layer 4a' with respect to opening 8 and 9, the structuring of area 20 and holes 24", is made symmetrical to the longitudinal axis L which runs parallel to the peripheral sides 10 and 11 and perpendicular to peripheral sides 6 and 7 and thus also perpendicular to middle axis M. Furthermore, the cooler layer 4a' is made symmetrical to middle axis M with respect to holes 24" and also with respect to openings 8 and 9. Area 20a' consists of a plurality of openings which are labelled 21a in FIGS. 2–8 and of a plurality of crosspiece-like material sections 24 which form a hexagonal latticework with a plurality of hexagonal ring structures which directly adjoin one another and in which the corner points are each formed by round or circular disk-like partial areas or islands 25 with a width increased in comparison to crosspieces 24. Due to the hexagonal ring structures, each island 25 forms a node from which a total of three material crosspieces 24 proceed. Each opening 21a is surrounded by a ring structure. The center points of islands 25 form the corner points of adjoining hexagons with the same side length each. Furthermore, the connecting lines between the middle points of islands 25 form the longitudinal extension of material crosspieces 24.

Figure 5:
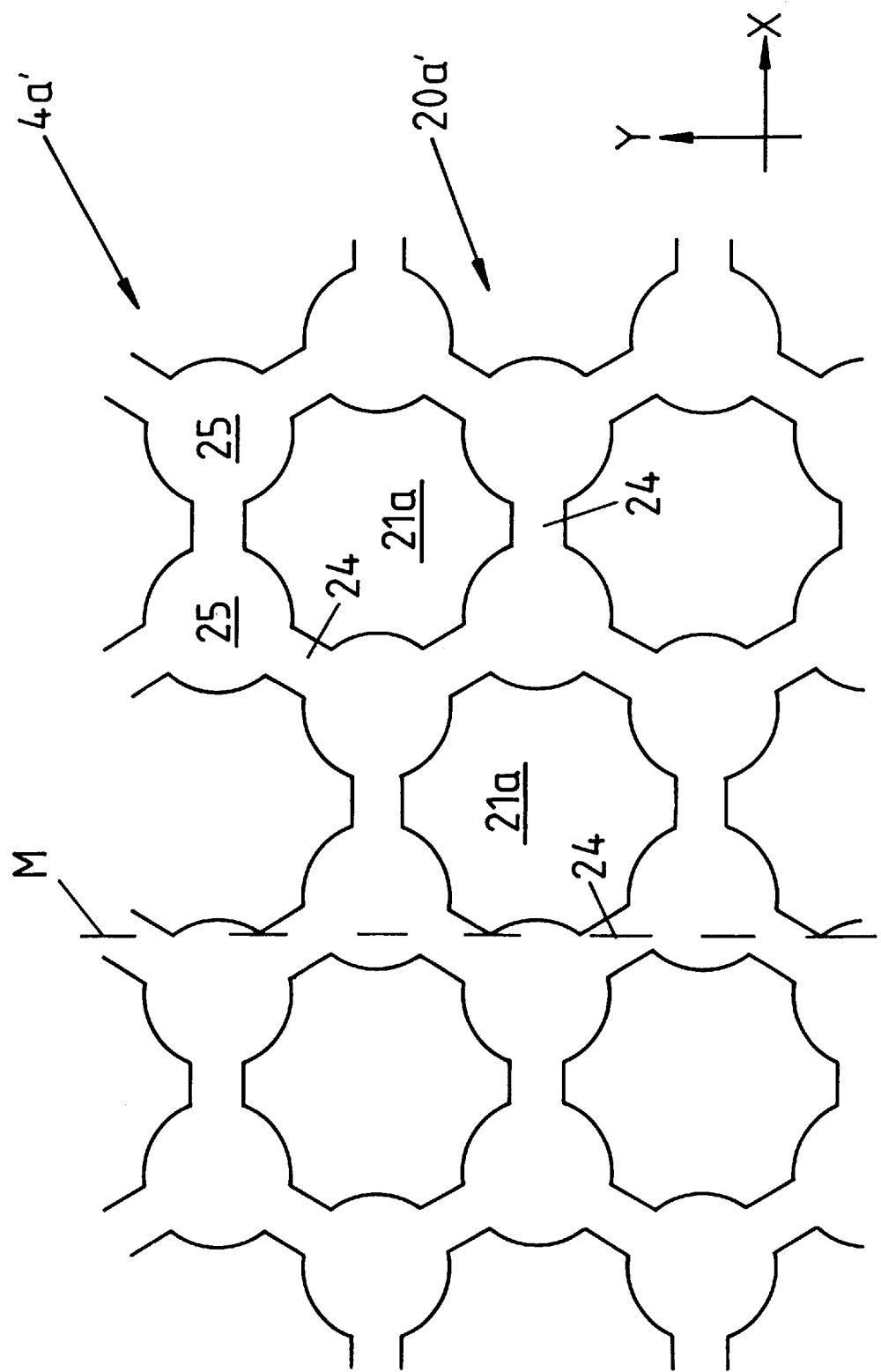
FIGS. 5 and 6 show in an enlarged partial view the cooler layers of FIGS. 2 and 3 each in the region of middle axis M.
Figure 6:
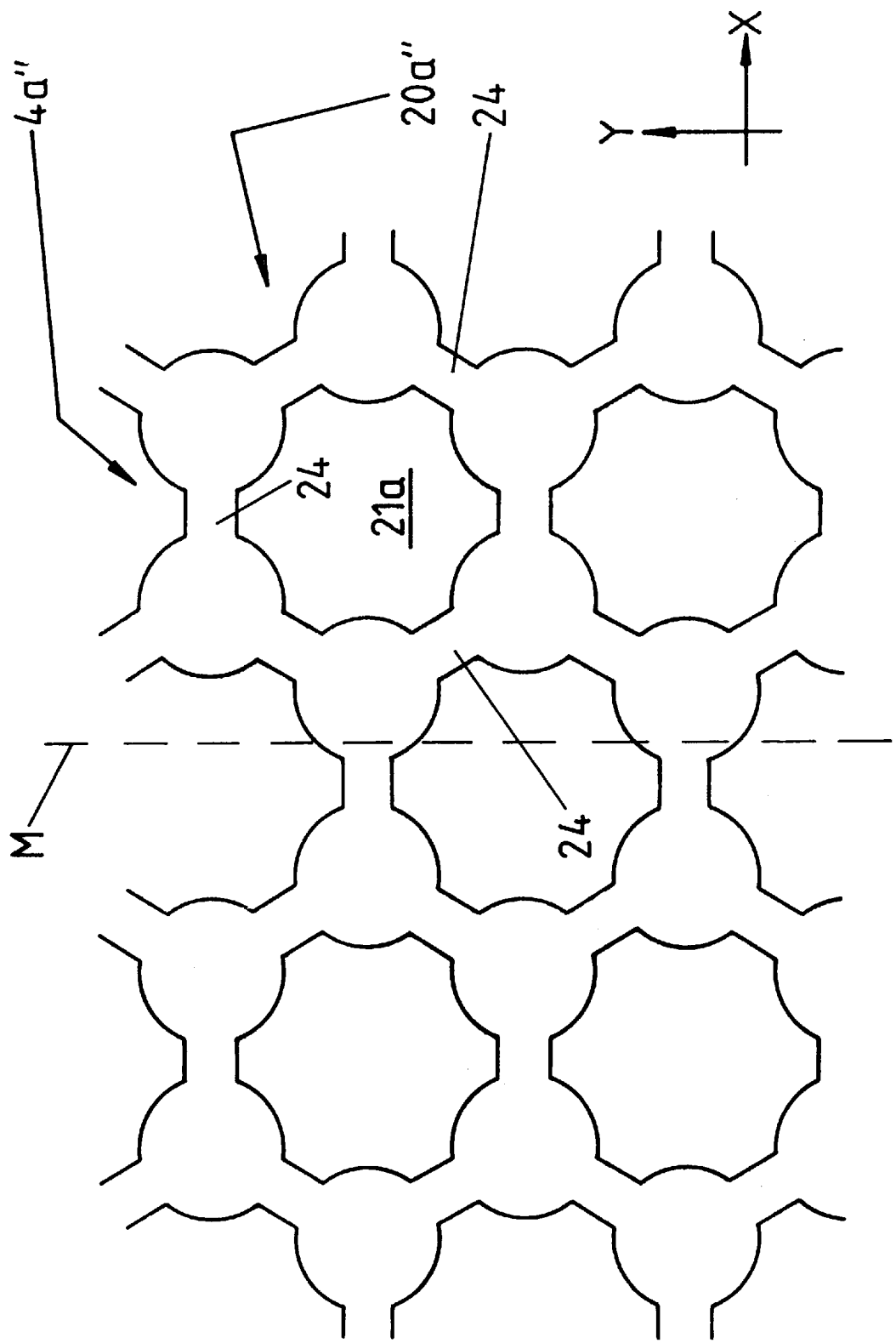

For simpler orientation, in the Figures, two coordinate axes which run at a right angle to one another, specifically the X-axis and Y-axis, are plotted, of which the X axis is parallel to longitudinal axis L and thus parallel to peripheral sides 10 and 11 and the Y-axis is parallel to middle axis M and thus parallel to peripheral sides 6 and 7. As is shown in FIG. 5, the ring structures formed by crosspieces 24, and island 25 are oriented such that two peripheral sides of each hexagon located parallel to one another, i.e. two material crosspieces 24 of each hexagonal ring structure which run parallel to one another with their longitudinal extension, lie in the X axis and these two material crosspieces are offset against one another in the direction of the Y axis. Other four material crosspieces 24, of each complete ring structure, include an angle of 60 degrees with the X-axis and Y-axis. As the Figures also show, islands 25 have a diameter which is less than the diameter of respective opening 21a.

Figure 2:
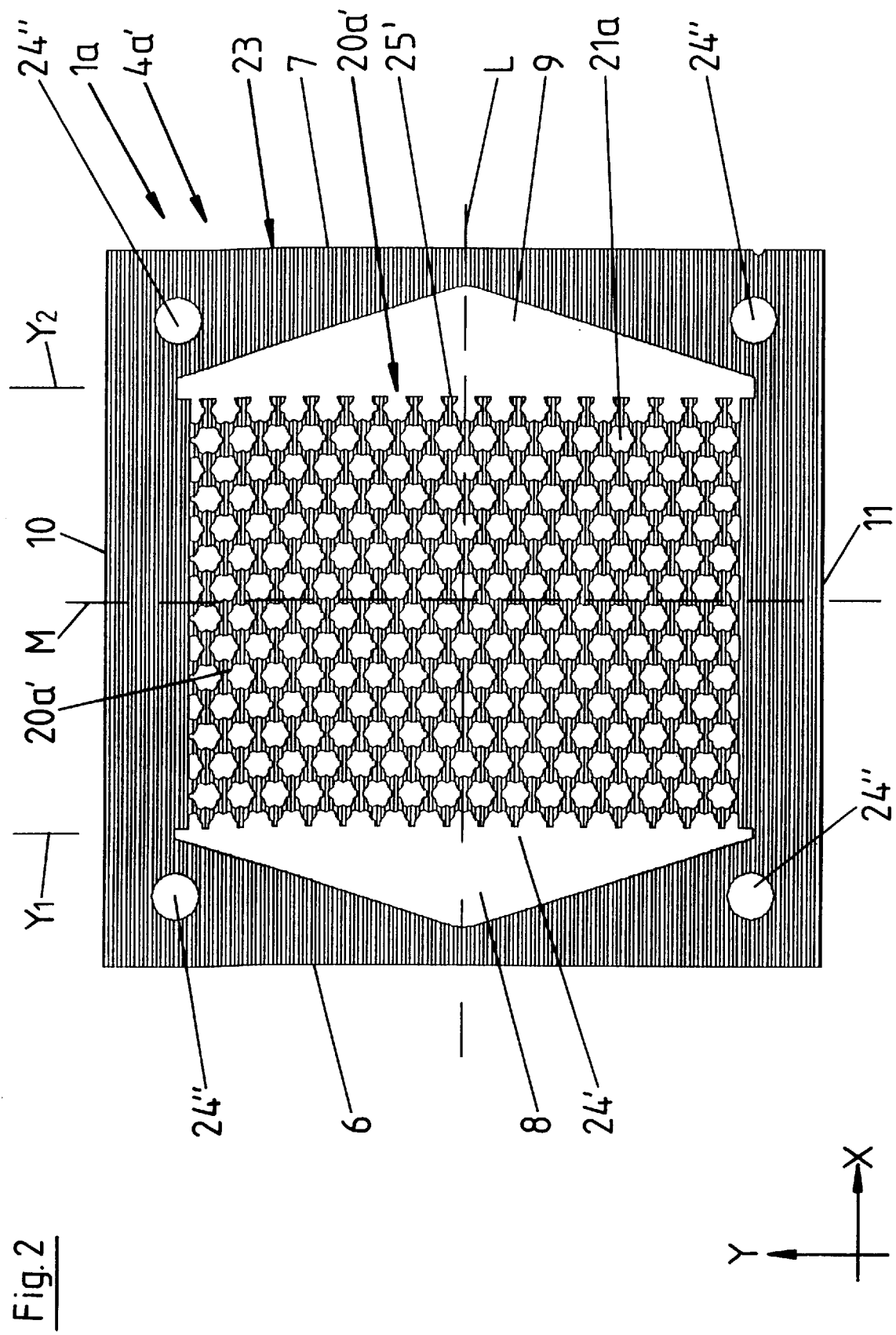
FIGS. 2 and 3 each show in an individual view and overhead view two cooler layers N1 and N2 following one another in a stack in a first possible embodiment of the invention.
Figure 3:
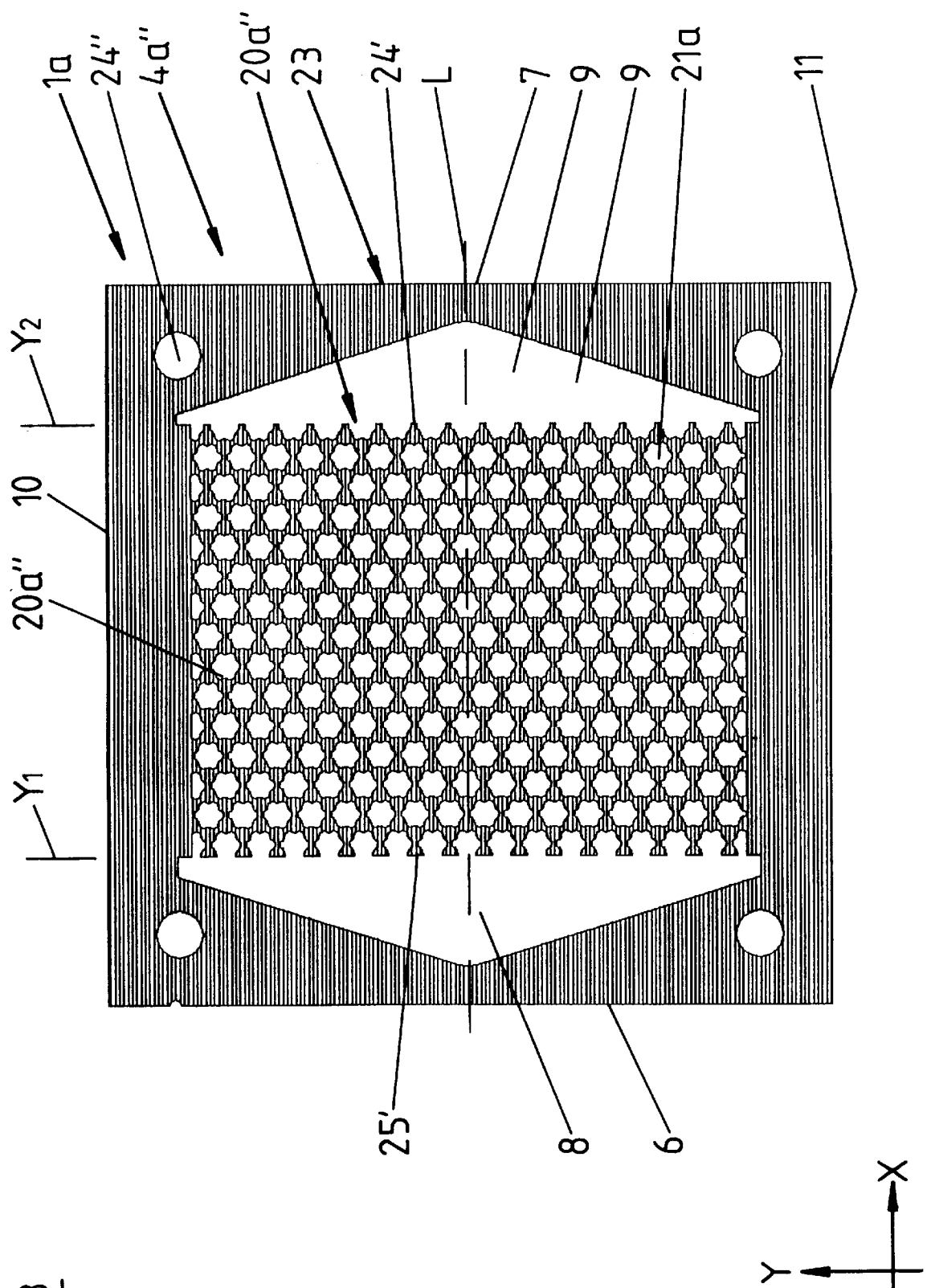
Figure 4:
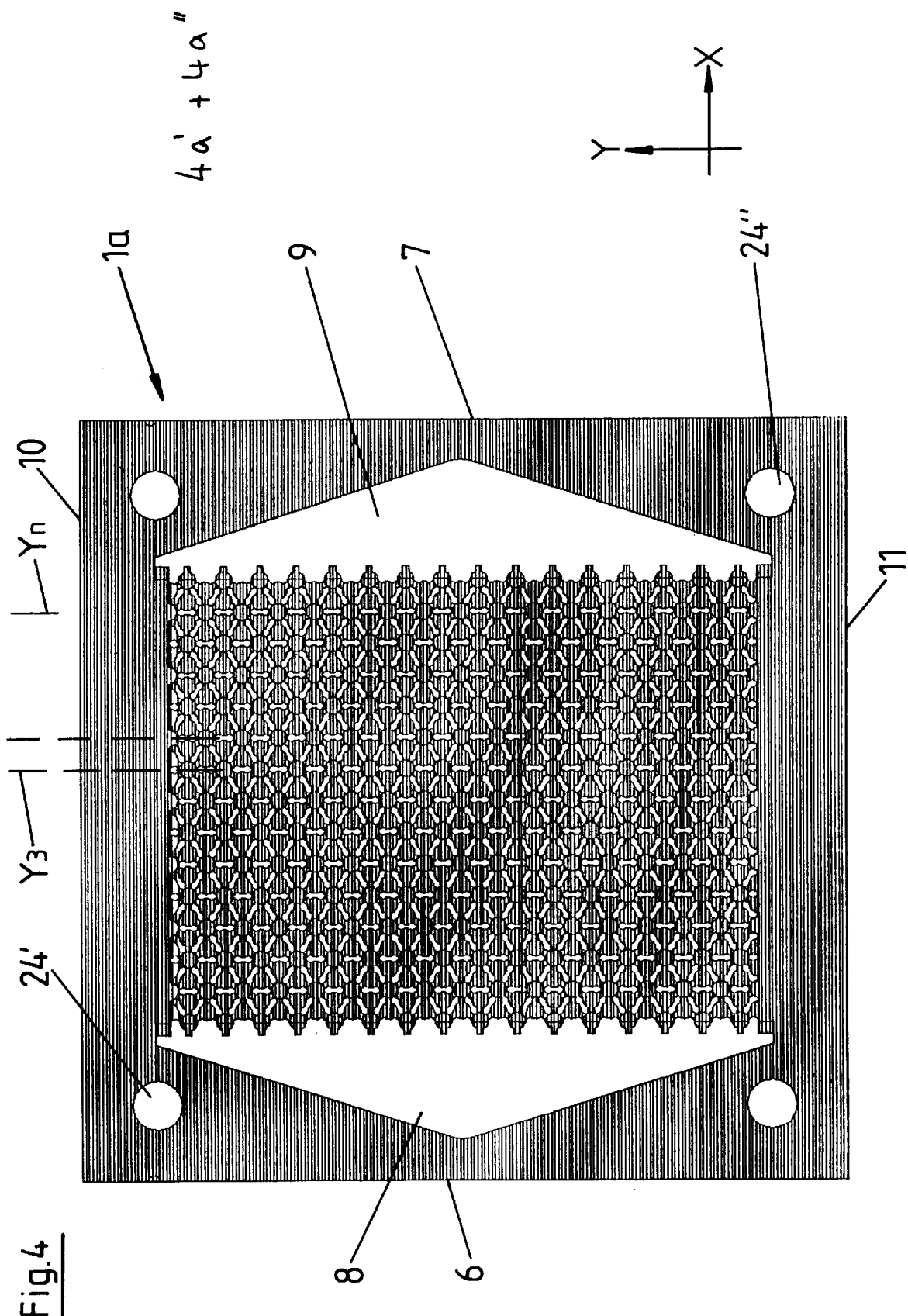
FIG. 4 shows an overhead view of the two layers of FIG. 2 located on top of one another in the cooler.

As FIG. 2 shows, area 20a' ends on openings 8 and 9. On the opening 8, incomplete ring structures, that is, half a ring structure exists, such that the material crosspieces 24 with a half length project away from islands 25 in the direction of the X axis, and end at 24'. On opening 9, area 20a' ends with incomplete ring structures such that the material sections 24, which extend in the direction of the X-axis, each ends in half island 25 at 25', adjoin islands 25.

As FIG. 2 shows, ends 24' lie in the region of opening 8 on common line Y1 which runs in the direction of the X-axis. Likewise, ends 25' lie on opening 9 on common line Y2 which runs in the direction of the Y axis. The distance line Y1 has in the direction of the X axis from the peripheral side 6 and from the center point of holes 24", which are adjacent to these peripheral sides, is equal to the distance which line Y2 has from the peripheral side 7 and the center point of holes 24" which are adjacent to these peripheral sides.

As was already detailed above, cooler layer 4a" is made identical to cooler layer 4a' which is turned around middle axis M by 180 degrees, i.e. for cooler layer 4a" on area 20a" ends 25' are within opening 8 on line Y1 and ends 24' are within opening 9 on line Y2. The described formation of areas 20a' and 20a" of cooler layers 4a' and 4a" results in that, for cooler layer 4a", the hexagonal ring structures in the direction of the X axis are offset by an amount equal to the distance of the middle points of the two islands 25 which follow one another in the direction of this axis and which lie on a common X-axis. If at this point the cooler layers 4a' and 4a" are placed on one another in alternation, according to FIGS. 4 and 7, it happens that for all layers individual islands 25 in the direction perpendicular to the planes of this layer are arranged congruently and thus form continuous columns 22, while other islands 25 in respective cooler layer 4a' or 4a" are each opposite opening 21a of adjacent cooler layers 4a" or 4a'.

Continuous columns 22 are each provided in a triangular structure, i.e. the intersections of the axes of these columns 22 with an imaginary plane parallel to layers 4a' or 4a" each form the corner points of triangles such that several of these intersections at a time lie on lines Y3, Y4 . . . Yn which run parallel to the Y axis and are offset against one another in the direction of the X axis by the same amount, the intersections on each line being offset against the intersections on an adjacent line in the middle to gaps.

The thickness of cooler layers 4a', and 4a" is for example roughly 0.2 to 1.0 mm. The average or grid distance of material crosspieces 24 which run in the direction of the X axis from one another in the direction of the Y-axis is for example 1.0 to 10.0 mm. The width of material crosspieces 24, is for example, roughly 5 to 25% of the aforementioned grid distance. The radius of islands 25 is at maximum equal to half the distance of the two corner points of the respective hexagon from one another, i.e. the diameter of each island 25 is at maximum equal to this distance or the side length of the hexagon.

Figure 7:
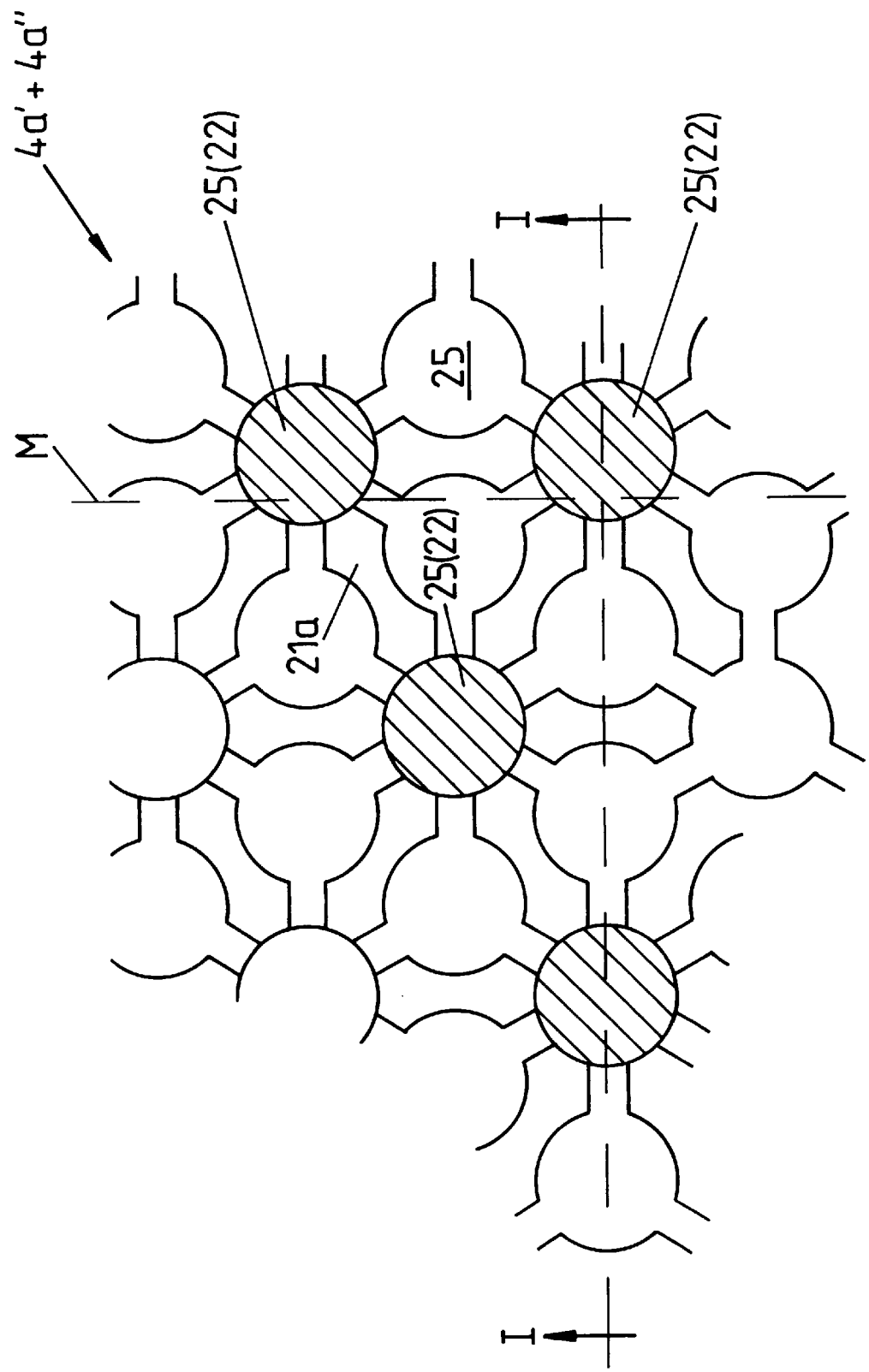
FIG. 7 shows an enlarged detailed view of FIG. 4.
Figure 8:
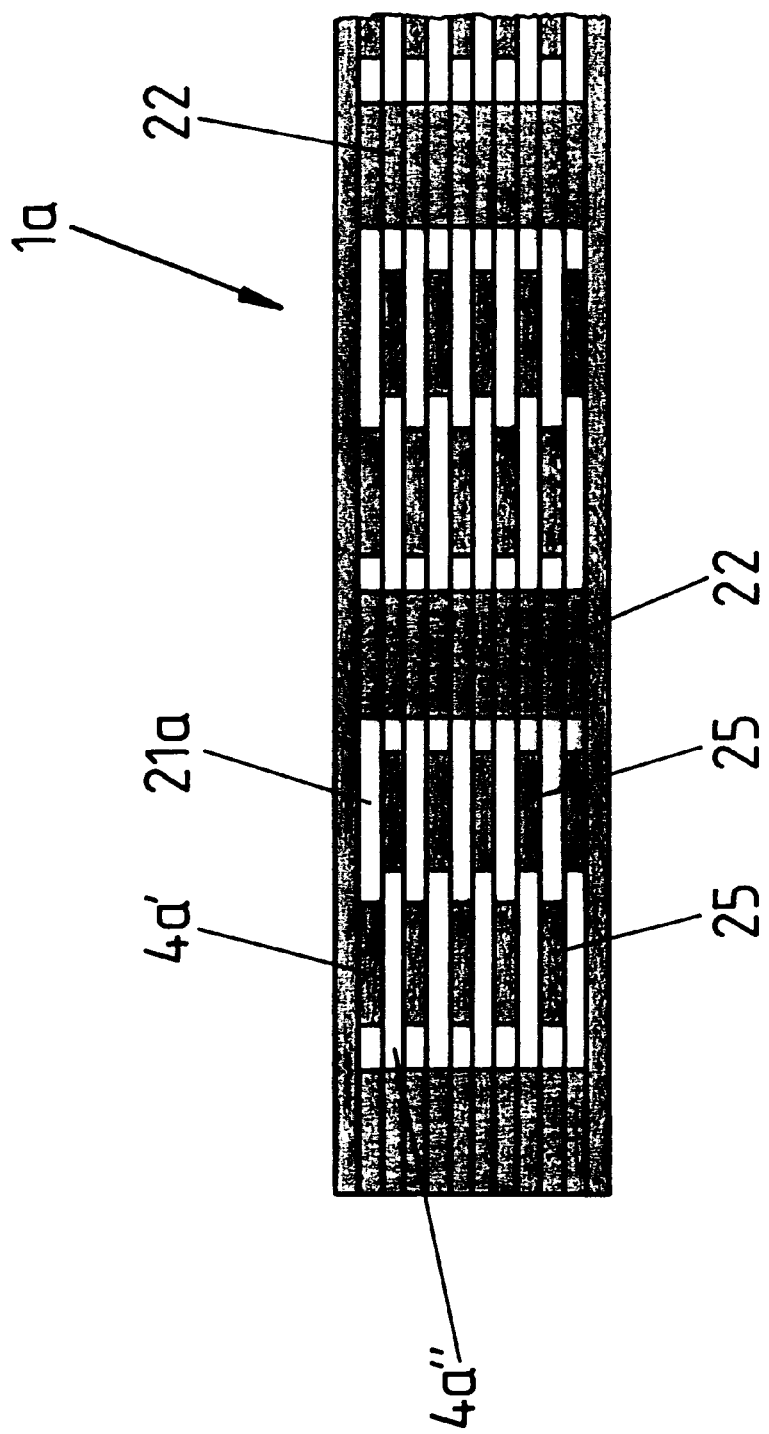
FIG. 8 shows in an enlarged view a partial section through the cooler corresponding to line I—I of FIG. 7.
Figure 9:
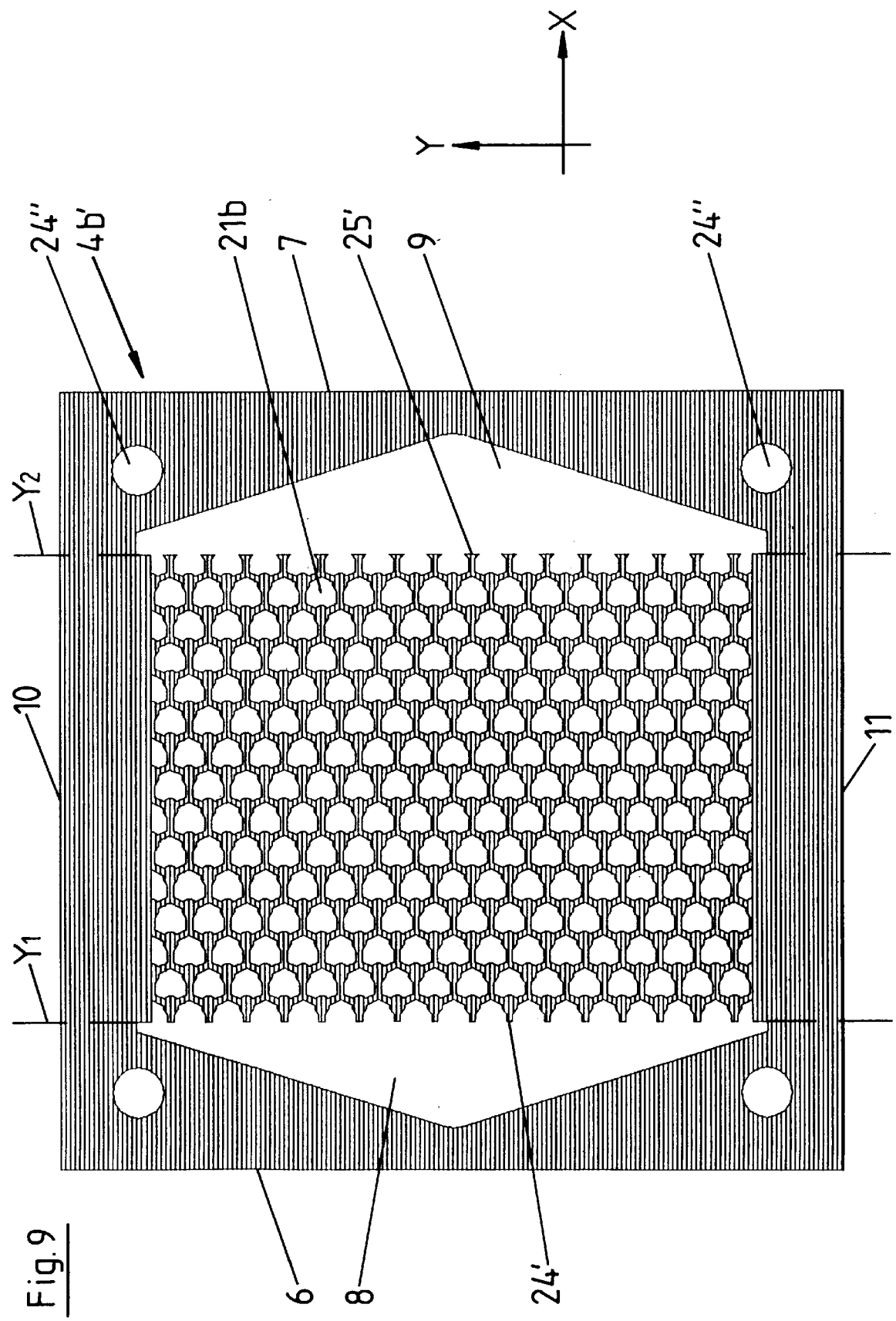
FIGS. 9–11 show views similar to FIGS. 2–4 in another modified embodiment.
Figure 10:
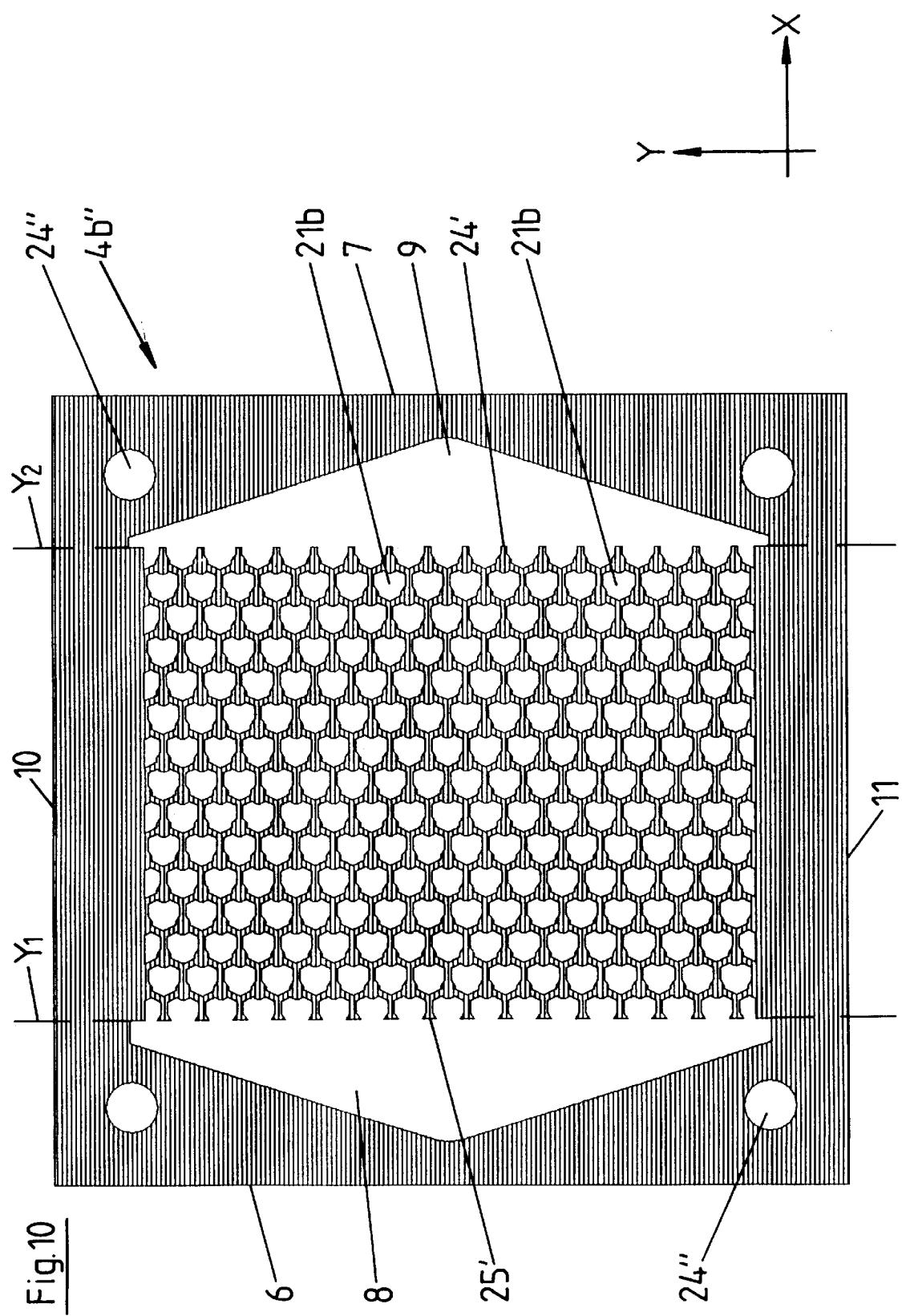
Figure 11:
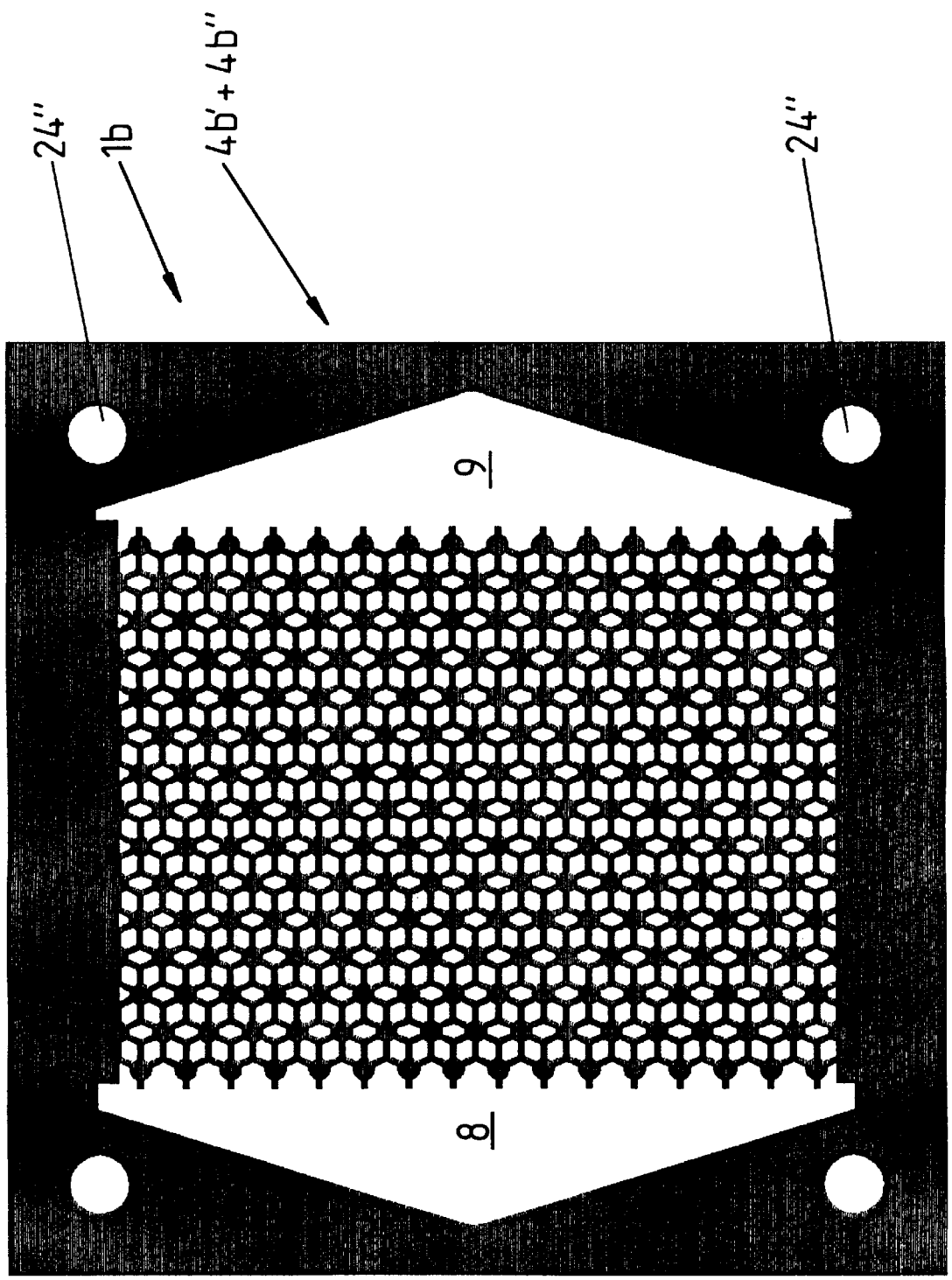
Figure 12:
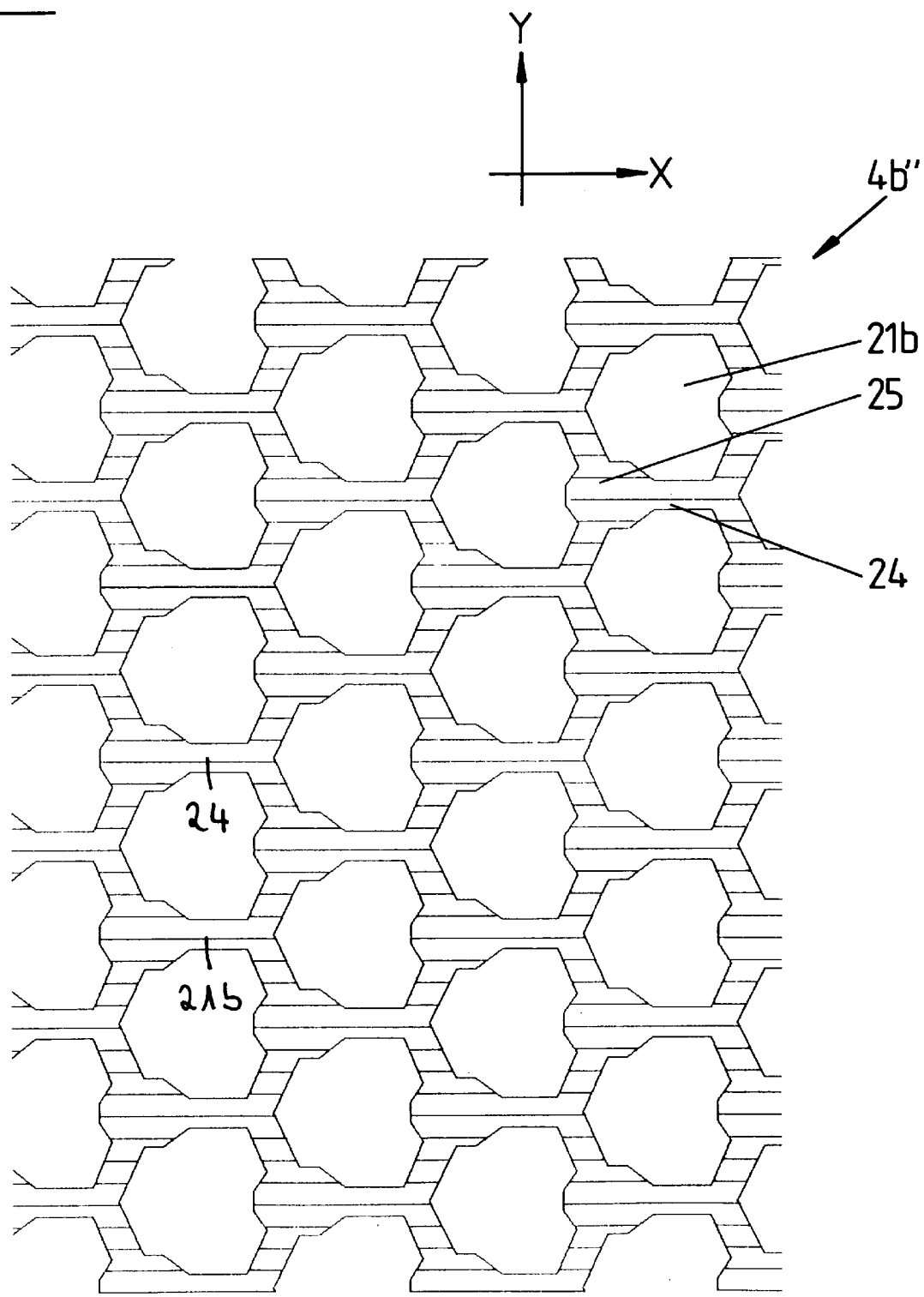
FIGS. 12 and 13 show views similar to FIGS. 5 and 6 in the embodiment of FIGS. 9–11.
Figure 13:
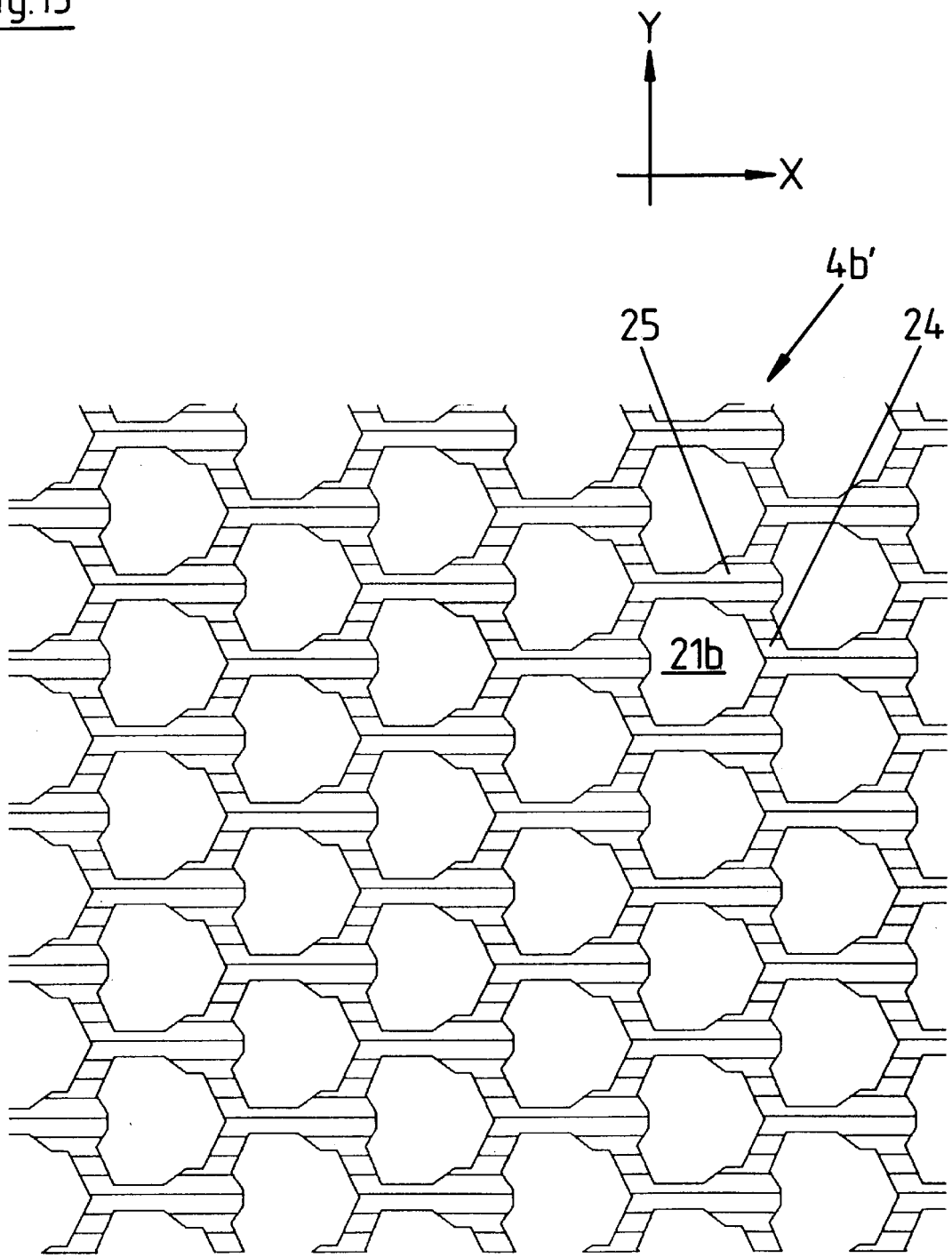

FIG. 8 shows a section corresponding to line I—I of FIG. 7. This section clearly shows that along the section line which runs in the direction of the X-axis, between two columns 22 at a time, openings are formed in cooler layers 4a' and 4a" such that within these openings, one island 25 of one cooler layer of opening 21 is opposite an adjacent cooler layer.

FIGS. 9–13 show in similar representations to FIGS. 2–7. Cooler layers 4b' or 4b" are shown for cooler 1b, which represent an alternative embodiment of the invention. These cooler layers differ from cooler layers 4a' or 4a" simply in that areas 20b' or 20b" are structured such that the material crosspieces 24 form adjoining hexagonal ring structures with openings 21b. In any case, on three corner points of each equilateral hexagon of each ring structure there is an island 25 such that the middle points of islands 25 in each ring structure form the corner points of an equilateral triangle, two of these corner points being located on a common line or triangle side which extends in the direction of the Y axis. In cooler layer 4b', in each ring structure, this common side of the equilateral triangle which runs in the direction of the Y axis is a greater distance from peripheral side 6 than the triangle apex which is formed by the middle point of the third island 25 and which is opposite this side.

For cooler layer 4b', ends 24' are in the area of opening 8 and ends 25' in the area of opening 9.

Cooler layer 4b" is made such that its structure corresponds to that of cooler layer 4b' turned around middle axis M by 180 degrees.

By alternately placing cooler layers 4b' and 4b" on top of one another in the stack which forms the cooler 1b, the islands 25 continually adjoining one another in all the stacks form columns 22 and between these columns are areas through which coolant can flow from the top to the bottom, or vice versa, and in which material crosspieces 24, extending away from columns 22 with branch points not formed by islands 25, are located between three material crosspieces 24 at a time.

In coolers 1a and 1b, each opening 21a or 21b, in one cooler layer, overlaps two openings 21a or 21b, at a time in an adjacent cooler layer. Furthermore, the cooler layers, with their openings, are arranged such that the openings of every other cooler layer in the axial direction perpendicular to the plane of the cooler layers are congruent.

FIGS. 14–20 show as another possible cooler embodiment 1c and cooler layers 4c' and 4c" which form this cooler. Cooler layers 4c', and 4c" differ from cooler layers 4a' and 4a" by the type of structuring of areas 20c' and 20c", i.e. aside from the embodiment detailed below the aforementioned statements on cooler layers 4a' and 4a" also apply to these cooler layers.

Figure 14:
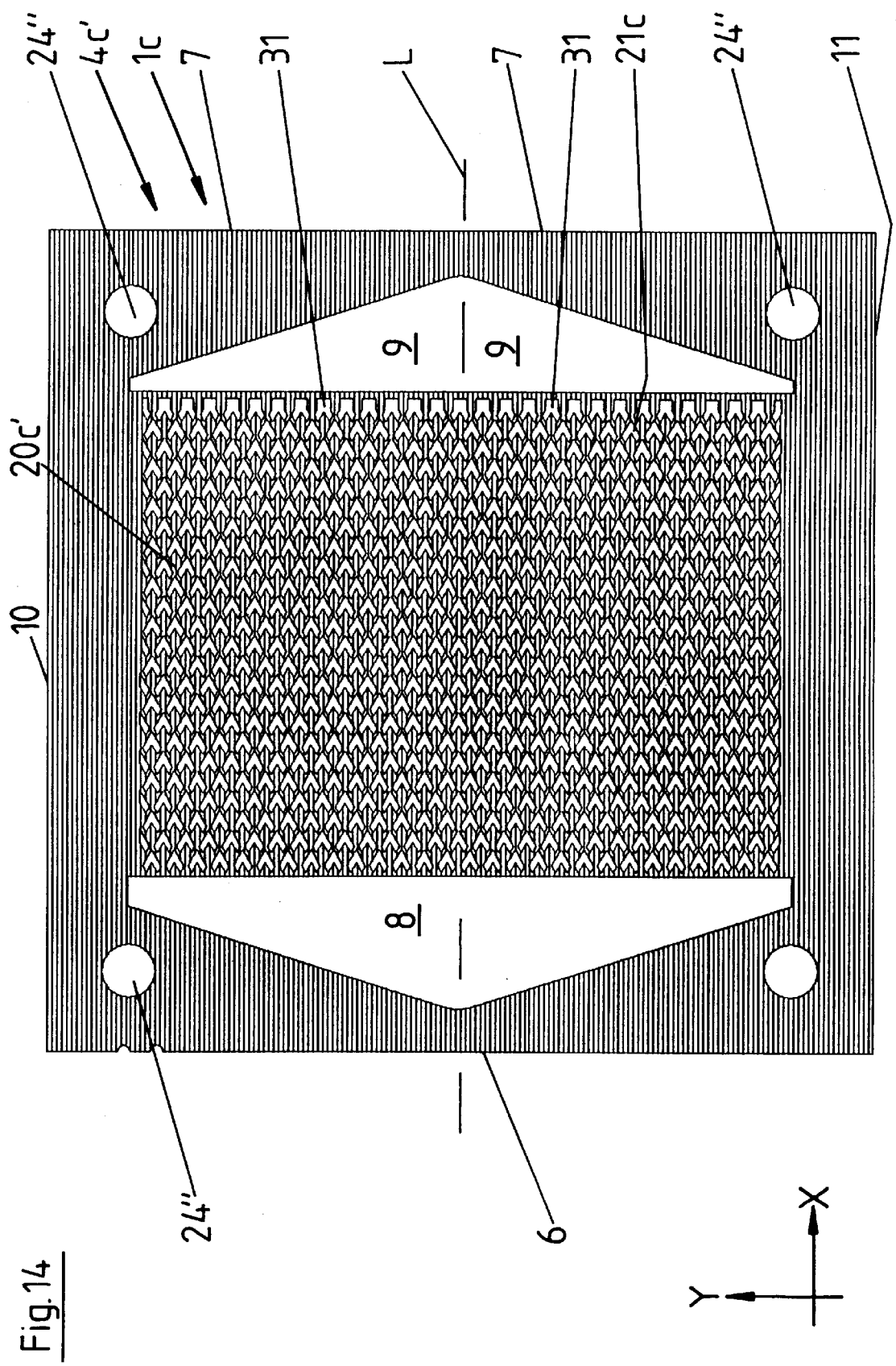
FIGS. 14–16 show views similar to FIGS. 2–4, but in another possible embodiment of the cooler as claimed in the invention.
Figure 15:
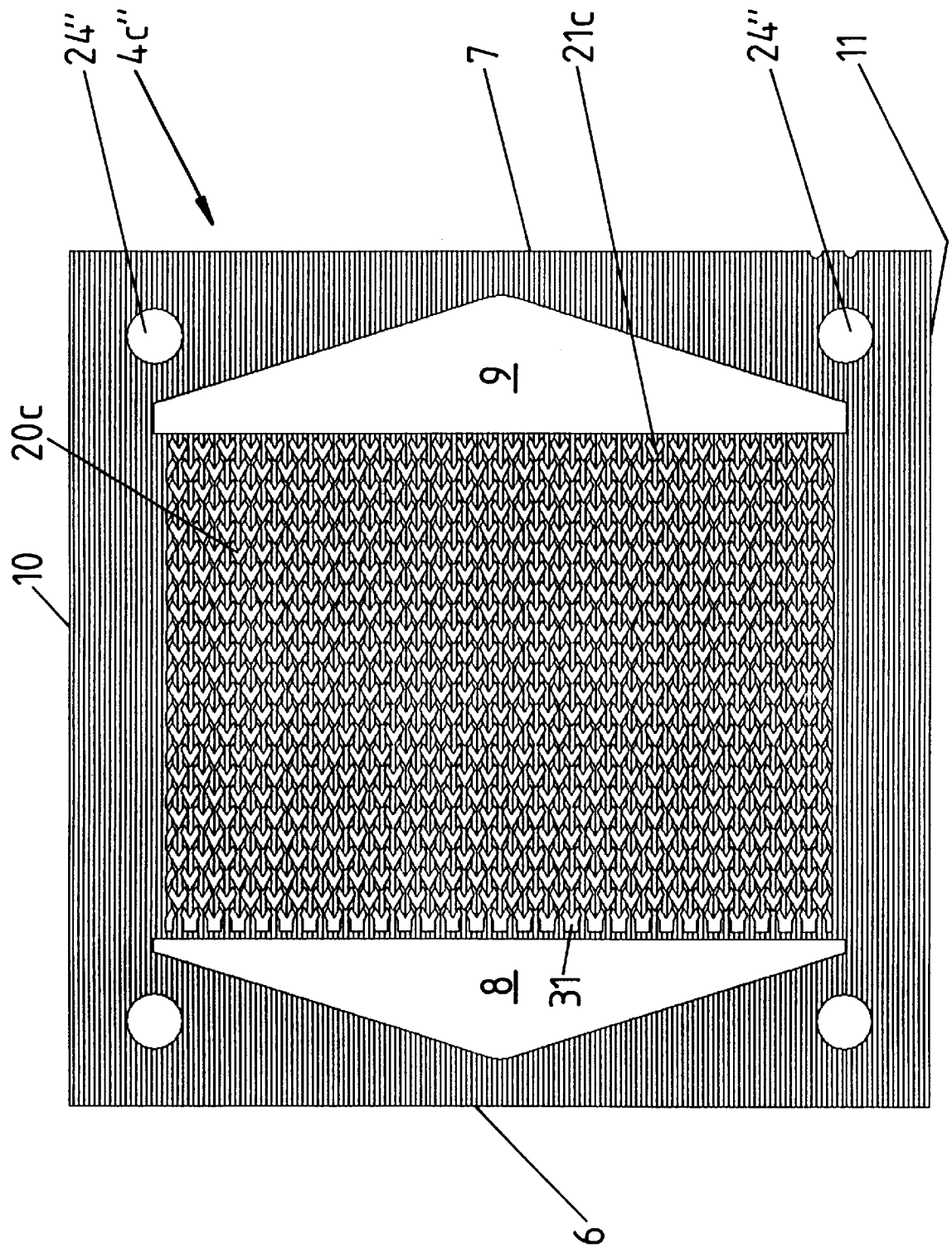
Figure 16:
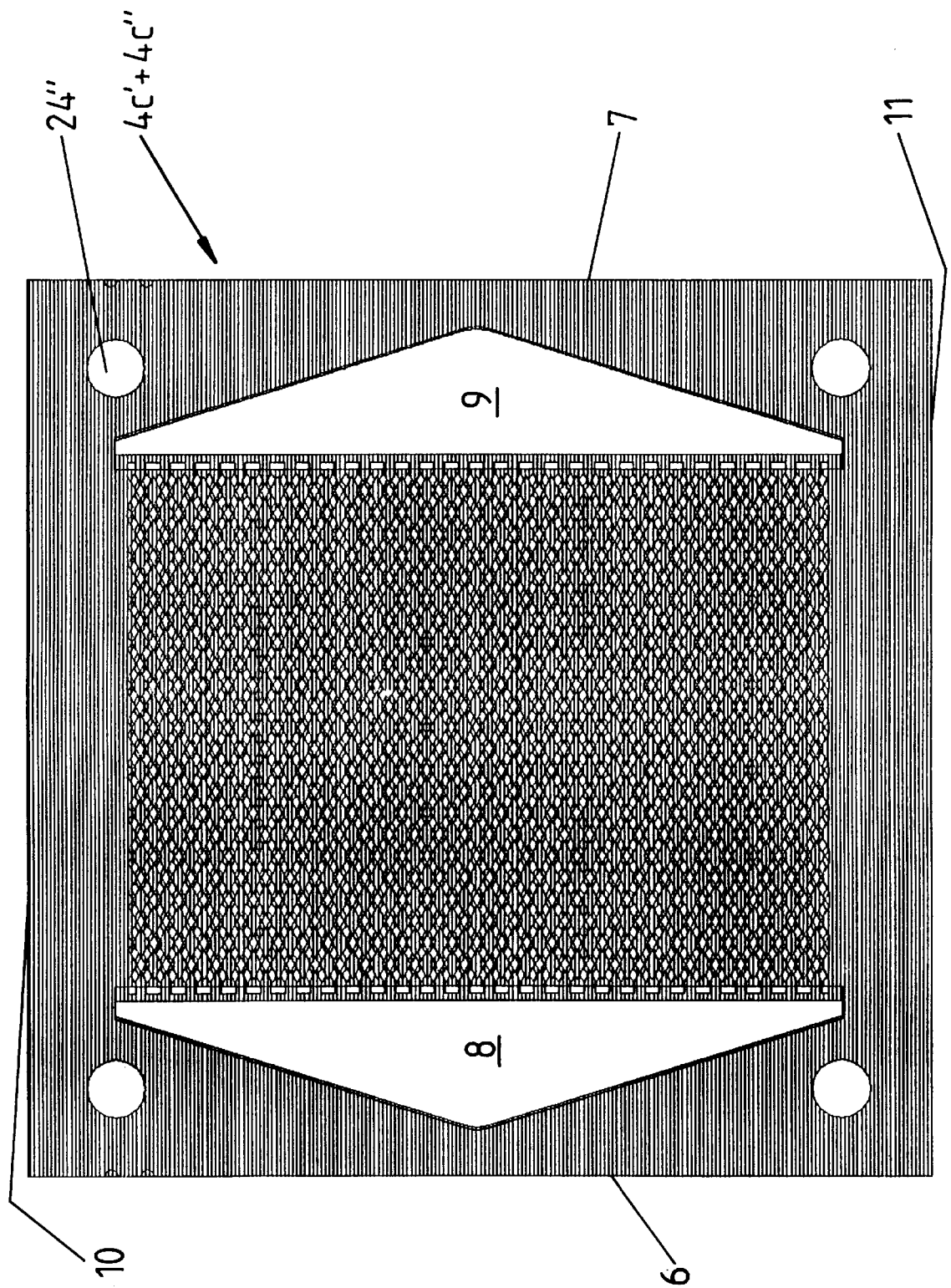
Figure 18:
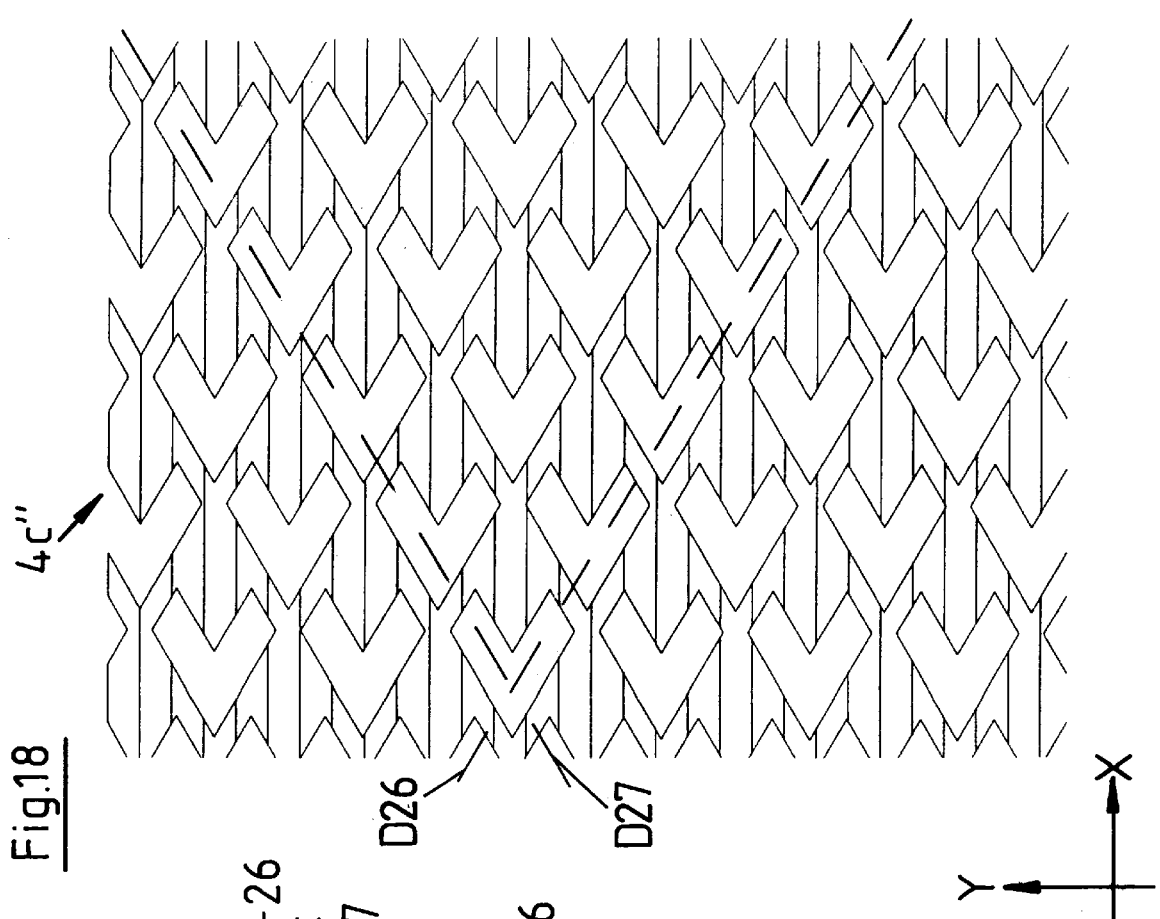
FIG. 18 shows an enlarged detailed view of FIG. 16.
Figure 17:
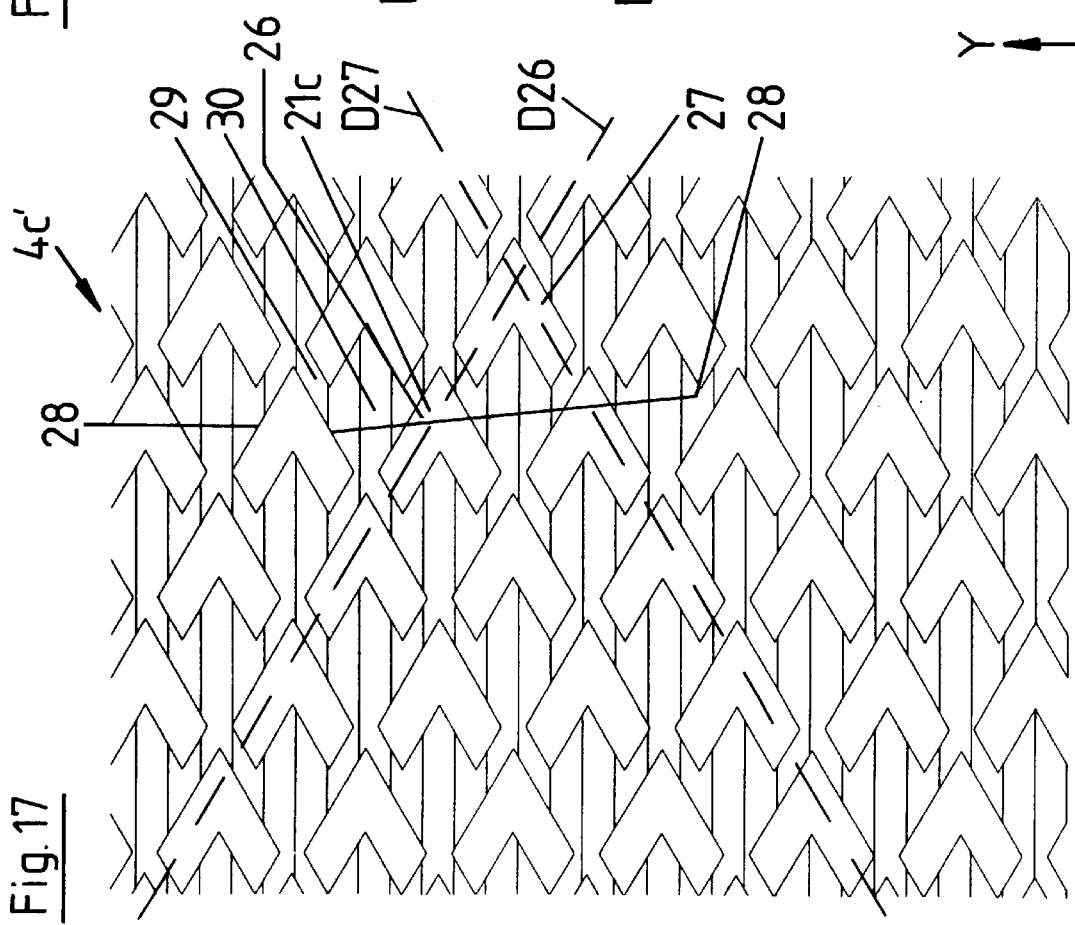
FIG. 17 shows an enlarged detailed view of FIG. 14.

As FIGS. 14 and 17 in particular show, area 20c' of cooler layer 4c' structured in the manner of a screen is formed by introducing into the material a plurality of openings 21c, of which each consists of two slots, or sections 26 and 27, which pass into one another and which lie with their longitudinal extension on diagonal D26 (section 26) or on diagonal D27 (section 27) which with the X-axis include an angle of less than 90°. In the embodiment shown, the X-axis forms the angle bisector of intersecting diagonals D26 and D27 which at its respective intersection point include an angle less than 90 degrees. The intersection angle formed by diagonals D26 and D27 are each open to a peripheral side 6 or the opening 8. Furthermore, for all openings 21c, the outer side lengths 28 of sections 26 and 27 are the same. Furthermore, a plurality of openings 21c, with their sections 26, each lie on common diagonal D26 and with their sections 27 on common diagonal D27, a plurality of these diagonals D26 are parallel and are at a distance to one another, and a plurality of these diagonals D27 being parallel and at a distance to one another such that along each diagonal D26 one opening 21c or its section 26 with interposed material crosspiece 29 adjoins opening 21c or its section 26. Likewise, the openings 21c are arranged such that in the direction of each diagonal D27, each opening 21c or its section 27, via material crosspiece 30 adjoins another opening 21c or its section 27, etc.

On opening 8, the area 20c' has a closed edge which adjoins towards middle axis M a first row of a plurality of openings 21c which extends in the direction of the Y axis.

At the opening, area 20c' has a closed edge which adjoins, towards middle axis M, a row of openings 31 which extends in the direction of the Y axis, and which openings are made essentially square and into which one opening 21c at a time passes with its angular area formed by the overlapping of sections 26 and 27. The arrangement of openings 21c' is such that each diagonal 26 intersects diagonal D27 on longitudinal axis L.

Cooler layer 4c" with respect to the structuring of area 20c" is in turn identical with cooler layer 4c' which is turned 180 around middle axis M.

Figure 20:
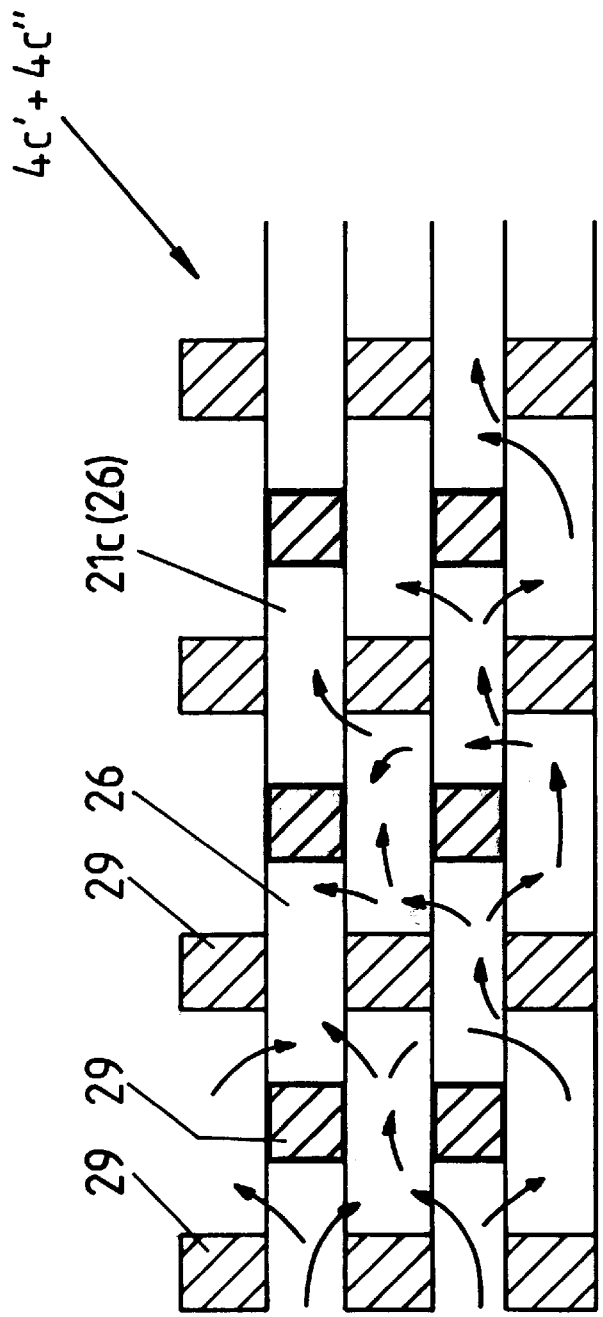
FIG. 20 shows a partial section through the cooler of FIGS. 14–19 according to line II—II of FIG. 19.

The above described execution of two cooler layers 4c' and 4c" results in the fact that in cooler layers 4c' and 4c" which are congruent with their holes 24 and which are located alternatingly on top of one another in the stack, each diagonal D26 of one cooler layer 4c is congruent with diagonal D26 of the adjacent cooler layer and the same also applies to diagonal D27, openings 21c of adjacent cooler layers each overlapping on the ends of sections 26 and 27 in an area which is smaller than side length 28, and cooler layers 4c' and 4c" with material areas 32 which are each formed between adjacent openings 21c outside of material crosspieces 29 and 30 continuously overlapping one another and thus the columns 22 are formed. Outside of these continuous columns, the cooler 1c has an inner structure which enables the flow of the coolant through the cooler 1c, with continuous changing of the planes and with intensive flow through the material sections outside of the posts 21, or the material crosspieces 29 and 30, as is illustrated in FIG. 20 with the arrows there which reproduces a section according to section line II—II, i.e. along diagonal D26. As FIG. 20 also shows, each opening 21c, or section 26 of this opening, is opposite material crosspiece 29 of an adjacent cooler layer, the material crosspiece 29 is located in the middle of opposite section 26. A similar picture arises in a section along diagonal D27.

In the cooler 1c, each opening 21c in a cooler layer overlaps two openings 21c in an adjacent cooler layer. Furthermore, the cooler layers, with their openings 21c, are arranged such that the openings of every other cooler layer are oriented in the same direction and are congruent in the axial direction perpendicular to the plane of the cooler layers.

Figure 21:
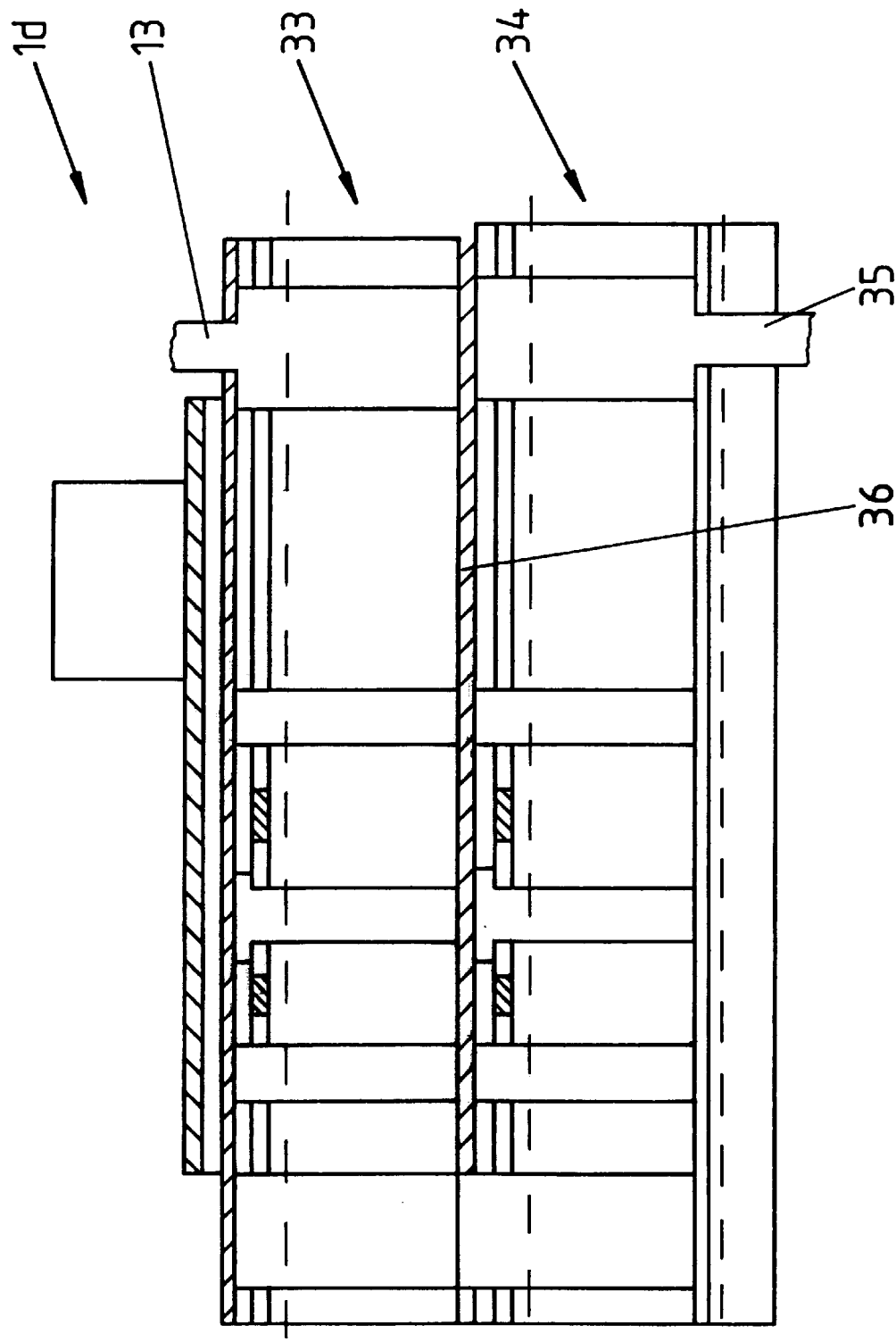
FIG. 21 shows in a view similar to FIG. 1 another possible embodiment of the cooler as claimed in the invention in which there are two individual coolers following one another in a cascade.
Figure 22:
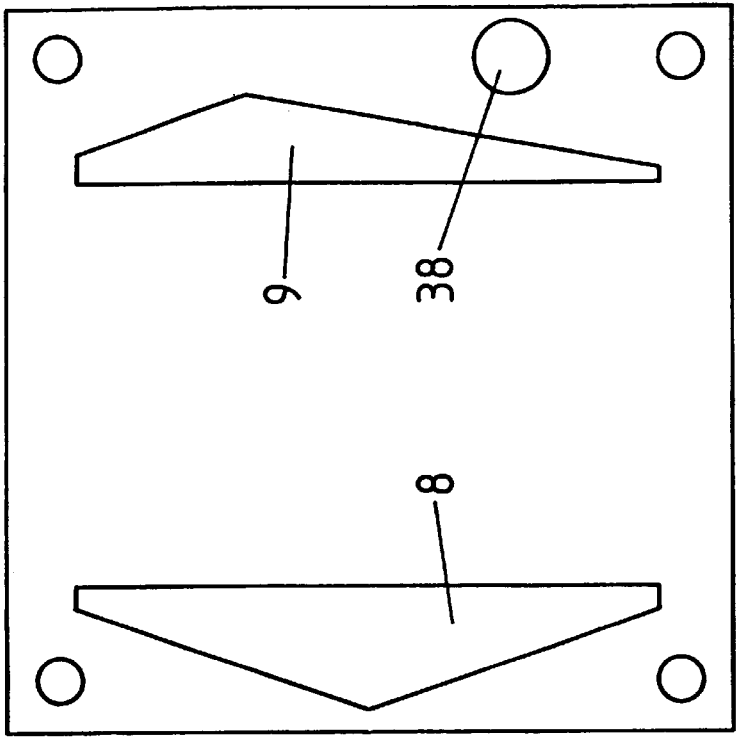
FIG. 22 shows in a simplified view a section of an intermediate or separating layer which separates the two individual coolers.

FIG. 21 illustrates another possible embodiment. Cooler 1d is shown, which differs from cooler 1 in that two individual coolers 33 and 34, which are made like each coolers 1a, 1b or 1c, are on top of one another. Coolant in counterflow, flows through the two individual coolers 33 and 34, such that coolant is supplied at one inlet 35 of lower the cooler 34 and leaves upper the cooler 33 on connection 13 there. To achieve the desired flow through two the coolers 33 and 34, an intermediate or separating layer 36 is provided between these two coolers. Separating layer 36, which is shown in FIG. 22, consists essentially of a metal sheet, or metal foil, which has a window 37 which produces a connection between two collection spaces 8', of lower and upper individual cooler 33 and 34, which however separates collection spaces 9' of the cooler 1d.

Figure 23:
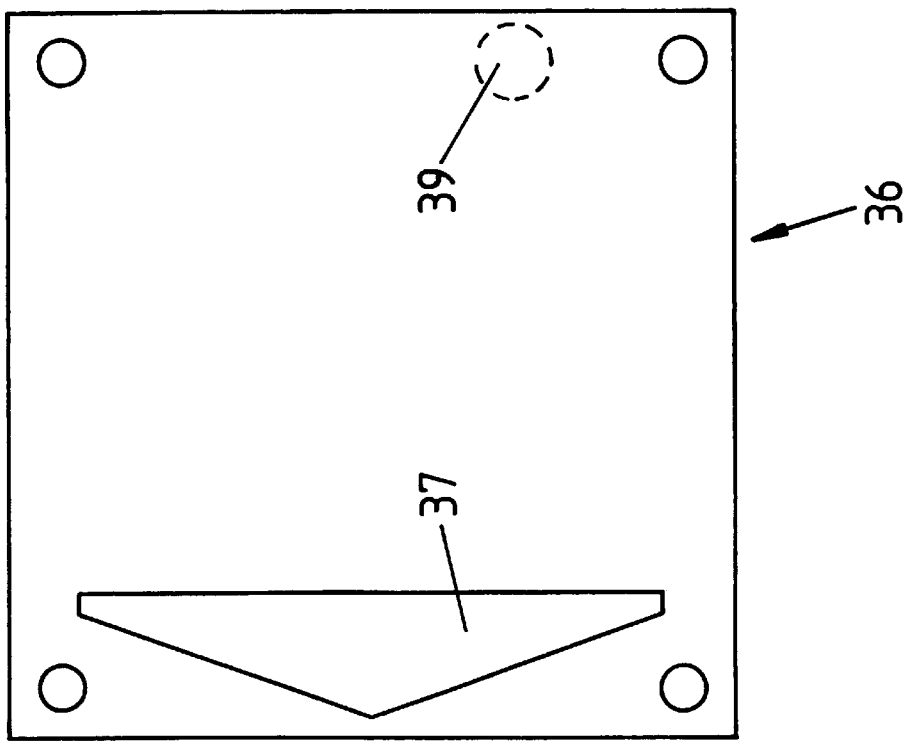
FIG. 23 shows fundamentally the formation of the cooler layers for connections routed out on one common side of the cooler.

Basically in cooler 1d, it is possible to provide connections 13 and 35 on a common side, specifically on the top of cooler 1d. In this case, the openings 9, of cooler layers 4, which form upper cooler 33 are made in the manner shown in FIG. 23 such that in addition to the opening 9 of each cooler layer 4, there is a separate hole 38. For mounted cooler 1d, these holes 38, of all cooler layers 4, are congruent with one another and congruent with hole 39 which is provided in a separation layer 36 and which discharges into collection space 9 of lower cooler 34. Holes 38 and 39 form a channel via which the coolant can be supplied at the top of cooler 1d.

Similarly, it is also possible to supply the coolant for cooler 1d on the bottom. In this case, the cooler layers, of lower individual cooler 34, are made according to FIG. 23, separating layer 36 in turn having the form shown in FIG. 22.

In the cooler, as claimed in the invention, a liquid medium, for example, water, oil, etc. is preferably suitable as the coolant.

The cooler, as claimed in the invention, can be made as an evaporation cooler, for example, as a heat pipe or evaporation cooler, using a coolant which is supplied first of all in liquid form to the cooler and then evaporated in the cooler or the flow labyrinth formed there and is discharged as a vapor on the coolant return and reliquified outside the cooler by releasing heat.

Figure 24:
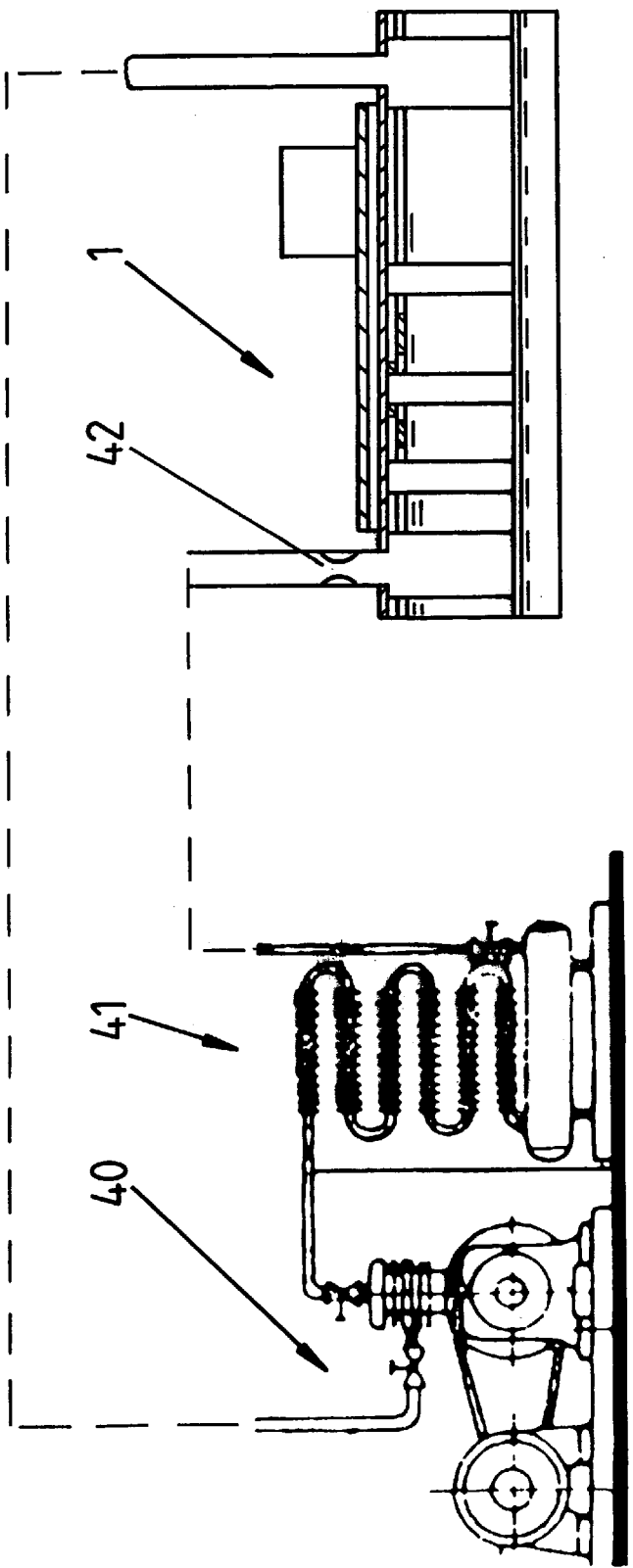
FIG. 24 shows a cooler made as an evaporation cooler as claimed in the invention.

FIG. 24 shows in schematic form one such evaporation cooling circuit, which among others has compressor 40, external heat exchanger or cooler 41 and expansion nozzle 42 located on cooler 1, for example, on the inlet to collecting channel 8'. The liquid coolant cooled in the external cooler 41 and liquified with compressor 14 is expanded in cooler 1 and after flowing through cooler 1 is collected at collection space 9' in gaseous form and returned to compressor 40.

Figure 25:
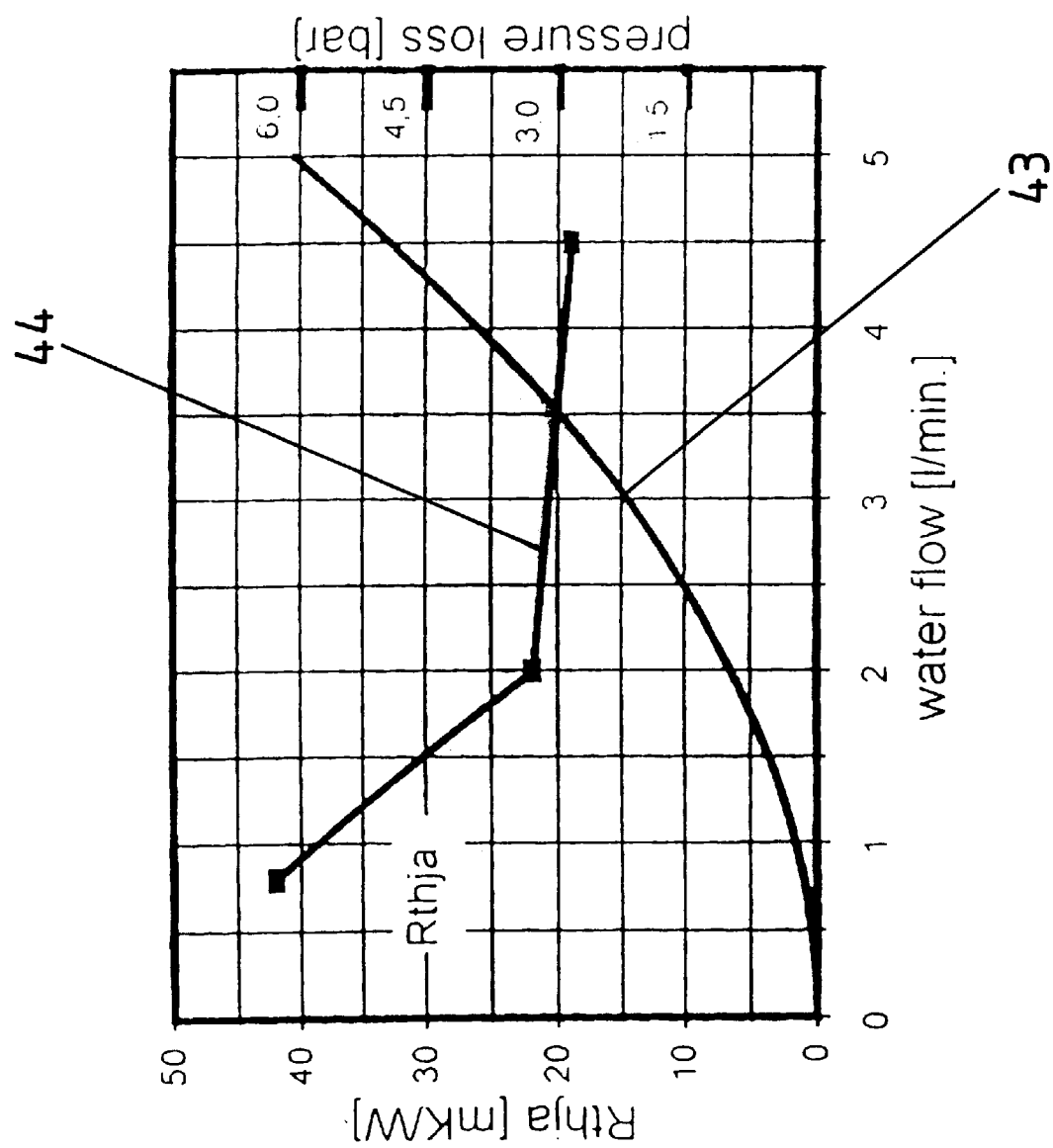
FIG. 25 shows a diagram which reproduces the action of the cooler as claimed in the invention.

The diagram in FIG. 25 in curve 43 shows the pressure loss within the cooler 1 and in curve 44 the cooling action, each as a function of the amount of coolant flow.

| Reference number list | |
|---|---|
| 1, 1a, 1b | cooler |
| 1c, 1d | cooler |
| 2, 3 | sealing layer |
| 4, 4d | cooler layer |
| 4a', 4a" | cooler layer |
| 4b', 4b" | cooler layer |
| 4c', 4c" | cooler layer |
| 6, 7 | peripheral side |
| 8, 9 | opening |
| 8', 9' | collection space |
| 10, 11 | peripheral side |
| 12, 13 | connection |
| 14 | ceramic layer |
| 15 | metal coating |
| 16 | component |
| 17 | support element |
| 18 | channel |
| 19 | ceramic layer |
| 20 | area |
| 20a', 20a" | area |
| 20b', 20b" | area |

-continued

Reference number list

| | |
|---|---|
| 20c', 20c" | area |
| 21, 21a | opening |
| 21b, 21c | opening |
| 22 | column |
| 23 | cutout |
| 24 | material crosspiece |
| 24' | end |
| 25 | island |
| 25' | end |
| 26, 27 | section |
| 28 | side edge |
| 29, 30 | material crosspiece |
| 31 | opening |
| 32 | material area |
| 33, 34 | individual cooler |
| 35 | connection |
| 36 | separating layer |
| 37 | window |
| 38, 39 | hole |
| 40 | compressor |
| 41 | external cooler |
| 42 | nozzle |

We claim:

1. A cooler for use as a heat sink for electrical components or circuits, comprising a plurality of cooler layers, which are joined flat to one another, are stacked on top of one another and, wherein flow paths are formed through which a coolant flows and discharges into at least one first collection space for supply of the coolant and into a second collection space for draining the coolant, said first and second collection spaces being formed by first and second openings in said cooler layers, said flow paths are formed by structuring at least one area of the cooler layers as a screen, said screen having a plurality of openings which are formed by material crosspieces which branch in the manner of a network and which form a polygonal ring structure around each of said plurality of openings, wherein adjacent cooler layers adjoin one another such, that said material crosspieces overlap continuously from cooler layer to cooler layer and thereby form continuous columns, and that each opening of one cooler layer is opposite a material section of an adjacent cooler layer, said material section extending away from one of the continuous columns, so that a coolant flow through an opening is possible only around or past another material section of an adjacent cooler layer.

2. The cooler as claimed in claim 1, wherein said material crosspieces around each of said plurality of openings form a hexagonal ring structure.

3. The cooler as claimed in claim 2, wherein for said hexagonal ring structure, two polygon sides of each said ring structure which are located opposite and parallel to one another are oriented in a first axial direction (X axis), and wherein for the same or essentially the same structuring of a screen area of said cooler layers adjacent to one another in said cooler said structured areas are each offset by a length of one hexagon side in said first axial direction (X axis).

4. The cooler as claimed in claim 1, wherein at least three corner points of said polygonal ring structure which form a triangle, are enlarged in area or made as islands.

5. The cooler as claimed in claim 1, wherein all corner points of said polygonal ring structure are enlarged in area or made as islands.

6. The cooler as claimed in claim 5, wherein continuous columns are formed by said all corner points of said polygonal ring structure.

7. The cooler as claimed in claim 1, wherein said openings and said material section adjacent to said openings form flow paths which change continuously in the planes for said coolant between at least two collection spaces.

8. The cooler as claimed in claim 1, wherein said openings have cross sectional dimensions which are larger than the dimensions or the width of the respective material section opposite an opening.

9. The cooler as claimed in claim 1, wherein openings have dimensions which are larger than the dimensions or the width of the material sections or crosspieces which surround these openings.

10. The cooler as claimed in claim 1, wherein said cooler layers are made identically and in the cooler each said cooler layer is adjacent to another turned cooler layer.

11. The cooler as claimed in claim 1, wherein at least some of the cooler layers consist of metal or a metal foil of copper.

12. The cooler as claimed in claim 1, wherein on its top and/or bottom said cooler is provided with at least one layer of ceramic.

13. The cooler as claimed in claim 12, wherein said ceramic layer is provided with a metal coating which forms printed circuits, contact surfaces, or attachment surfaces.

14. The cooler in accordance with claim 13 wherein at least one of said printed circuits is an electrical component.

15. The cooler as claimed in claim 1, further comprising electrical components on at least one side of said cooler.

16. The cooler as claimed in claim 1, wherein said cooler layers are joined to one another using direct copper bonding technology or by diffusion bonding.

17. The cooler as claimed in claim 1, wherein at least two individual coolers are joined in the manner of a cascade to form an overall cooler.

18. The cooler as claimed in claim 17, wherein there is a separating layer between the said at least two individual coolers.

19. The cooler as claimed in claim 1, wherein said coolant is a liquid medium.

20. The cooler as claimed in claim 19, wherein said coolant is water or oil.

21. The cooler as claimed in claim 1, wherein said cooler is an evaporation cooler.

22. The cooler as claimed in claim 1, wherein each said opening in said cooler layer at least partially overlaps at least said openings in an adjacent cooling layer.

23. The cooler as claimed in claim 1, wherein said openings of every other said cooler layer are arranged congruently with one another.

24. A cooler for use as a heat sink for electrical components or circuits, comprising a plurality of cooler layers, which are joined flat to one another, are stacked on top of one another and wherein flow paths are formed through which a coolant flows and discharges into at least one first collection space for supply of the coolant and into a second collection space for draining the coolant, said first and second collection spaces being formed by first and second openings in said cooler layers, said flow paths are formed by structuring at least one area of the cooler layers as a screen, wherein the plurality of openings are made angled with two intersecting opening sections, wherein adjacent cooler layers adjoin one another such that the plurality of openings of adjacent cooler layers partially overlap, so that the plurality of openings of one cooler layer is opposite a material section or crosspieces between the plurality of openings of an adjacent cooler layer, so that a coolant flow through the plurality of openings is possible only around or past another material section of an adjacent cooler layer, and wherein material sections are structured as a screen remaining around the plurality of openings and overlap continuously from cooler layer to cooler layer and thereby form continuous columns, said columns being exposed to intensive flow of coolant all around and on all sides.

25. The cooler as claimed in claim 24, wherein each said opening has a first opening section and a second opening section which intersects it or passes into it, and wherein there are said first opening sections of said plurality of openings each on a common first axial line or diagonal following one another and separated from one another by material crosspieces, and wherein there are said second opening sections of said plurality of openings each on a second axial line or diagonal following one another and separated from one another by a material crosspieces.

26. A cooler as claimed in claim 25, wherein said diagonals intersect at an angle less than or equal to 90°.

27. The cooler as claimed in claim 24, wherein said openings include an angle which opens to opposite sides for said cooler layers adjacent to one another.

28. The cooler as claimed in claim 24, wherein said openings of adjacent cooler layers each overlap on end areas of opening sections which are at a distance from that area on which the sections pass into one another or intersect one another.

* * * * *